US012641911B2

(12) United States Patent (10) Patent No.: US 12,641,911 B2
Evirgen et al. (45) Date of Patent: May 26, 2026

(54) ARCHITECTURE FOR InGaAs/GaAsSb SUPERLATTICES ON AN InP SUBSTRATE

(71) Applicants: LYNRED, Palaiseau (FR);
COMMISSARIAT A L'ENERGIE ATOMIQUE ET AUX ENERGIES ALTERNATIVES, Paris (FR)

(72) Inventors: Axel Evirgen, Palaiseau (FR);
Jean-Luc Reverchon, Palaiseau (FR)

(73) Assignees: LYNRED, Palaiseau (FR);
COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 417 days.

(21) Appl. No.: 18/265,654

(22) PCT Filed: Nov. 26, 2021

(86) PCT No.: PCT/EP2021/083179
§ 371 (c)(1),
(2) Date: Jun. 6, 2023

(87) PCT Pub. No.: WO2022/135831
PCT Pub. Date: Jun. 30, 2022

(65) Prior Publication Data
US 2024/0113241 A1 Apr. 4, 2024

(30) Foreign Application Priority Data
Dec. 23, 2020 (FR) ...................................... 2014030

(51) Int. Cl.
*H10F 77/14* (2025.01)
*H10F 30/10* (2025.01)
(Continued)

(52) U.S. Cl.
CPC ........... *H10F 77/146* (2025.01); *H10F 30/10* (2025.01); *H10F 39/184* (2025.01); *H10F 77/1248* (2025.01)

(58) Field of Classification Search
CPC .... H10F 77/146; H10F 77/1248; H10F 30/21; H10F 30/223; H10F 71/1272; H10F 39/1843
See application file for complete search history.

(56) References Cited

U.S. PATENT DOCUMENTS

2012/0217475 A1 8/2012 Leavitt
2015/0179844 A1 6/2015 Ergun et al.

FOREIGN PATENT DOCUMENTS

EP 1 642 345 B1 11/2008
EP 3 482 421 B1 5/2020
(Continued)

OTHER PUBLICATIONS

Notice of Grounds for Rejection issued in Korean Patent Application No. 10-2023-7021250 dated Sep. 5, 2025, with English translation.

(Continued)

*Primary Examiner* — Matthew L Reames
(74) *Attorney, Agent, or Firm* — BakerHostetler

(57) ABSTRACT

A device for detecting infrared radiation includes at least one pixel comprising: a first superlattice composed of the repetition of an elementary group comprising: a first layer having a first bandgap and a first conduction-band minimum; at least a second layer having a second bandgap and a second conduction-band minimum strictly lower than the first conduction-band minimum; a third layer having a third bandgap narrower than the first and second bandgaps and a third conduction-band minimum strictly lower than the second conduction-band minimum. The elementary group is produced in a first stacking configuration in the following (Continued)

order: the second layer, the third layer, the second layer, then the first layer; or in a second stacking configuration such that the third layer is confined between the first and second layers.

19 Claims, 14 Drawing Sheets

(51) Int. Cl.
H10F 39/18 (2025.01)
H10F 77/124 (2025.01)

(56) References Cited

FOREIGN PATENT DOCUMENTS

| | | |
|---|---|---|
| JP | 2018-138903 A | 9/2018 |
| WO | 01/33677 A2 | 5/2001 |

OTHER PUBLICATIONS

Bhardwaj, et al., "Uniaxial strain induced optical properties of complex type-II InGaAs/InAs/GaAsSb nano-scale heterostructure", Optik, vol. 146, pp. 8-16, 2017.
Pan, et al., "Design and modeling of InP-based InGaAs/GaAsSb type-II "W" type quantum wells for mid-Infrared laser applications", J. Appl. Phys. 113, 043112, 2013.
Easley, et al., "InGaAs/GaAsSb Type-II Superlattices for Short-Wavelength Infrared Detection", Journal of Electronic Materials, vol. 48, No. 10, pp. 6025-6029, 2019.
English translation of the Notice of Reasons for Rejection issued in Japanese Patent Application No. 2023-538737 dated Jan. 6, 2026.

ARCHITECTURE FOR InGaAs/GaAsSb SUPERLATTICES ON AN InP SUBSTRATE

CROSS-REFERENCE TO RELATED APPLICATIONS

This application is a National Stage of International patent application PCT/EP2021/083179, filed on Nov. 26, 2021, which claims priority to foreign French patent application No. FR 2014030, filed on Dec. 23, 2020, the disclosures of which are incorporated by reference in their entirety.

FIELD OF THE INVENTION

The present invention relates to the field of IR imaging (IR standing for InfraRed) and in particular to a radiation detector or photodetector manufactured with heterostructures based on III-V semiconductors. More particularly, the invention relates to a device for imaging in the short-wave infrared (SWIR) at non-cryogenic temperatures.

BACKGROUND

Imagers operating in the infrared range are generally formed by assembling a matrix array comprising a plurality of photodiode-based elementary pixels that convert a flux of incident photons into photogenerated charge carriers, and a read-out integrated circuit (ROIC) for processing the electrical signal generated by the pixels of the detector.

By the "quantum efficiency" of a semiconductor-based infrared detector, what is meant is the ratio of the number of electron-hole pairs generated via the photoelectric effect to the number of photons passing through the structure of a pixel belonging to the detector of infrared radiation. Quantum efficiency depends on absorption coefficient and on diffusion length in the structure of the pixel along the pixel axis. Absorption coefficient depends on the materials used to produce the structure of the pixel. Diffusion coefficient is inversely proportional to the effective mass of the positive charge carriers (holes) and negative charge carriers (electrons) along the pixel axis.

Quantum efficiency is a fundamental technical characteristic on which the electro-optical performance of an infrared detector depends.

The invention addresses a technical problem in this field, namely that of how to design a matrix-array detector operating in the near infrared with a cutoff wavelength longer than 2 μm while improving the quantum efficiency of the detector with respect to prior-art solutions.

To better define the problem addressed by the invention, first the general structure of a pixel belonging to a semiconductor-based matrix-array infrared detector will be described.

FIG. 1a illustrates a perspective view of one example of a pixel belonging to a matrix-array detector for detecting infrared radiation operating in the domain of the infrared frequencies. The illustration is limited to a single pixel Pxl for the sake of simplicity, but it does not exclude integration of the pixel into a matrix array comprising a plurality of juxtaposed pixels.

The pixel Pxl of an infrared detector is produced using a stack of semiconductor layers forming the structure of the pixel on a substrate SUB. The pixel axis Δ is the axis perpendicular to the horizontal plane (x, y) formed by the upper surface of the substrate SUB. The substrate SUB is for example made of a bulk III-V semiconductor. The choice of the material of the substrate SUB is important because it determines the technology of the steps of the fabricating process of the device, but also the technical features (optical features, electrical features, mechanical features, etc.) of the matrix-array detector. The pixel Pxl comprises the following layers, starting from the substrate, in the direction of the pixel axis Δ: a lower contact structure CONT_INF, a planar absorbing structure SPA and an upper contact structure CONT_SUP.

The lower contact structure CONT_INF is made of an $n^+$-doped bulk semiconductor and has a valence-band maximum lower than the valence-band maximum of the planar absorbing structure SPA. Preferably, the semiconductor from which the lower contact structure is made is a III-V semiconductor such as, by way of example, gallium arsenide, indium arsenide, gallium nitride, gallium antimonide, boron phosphide, or a ternary, quaternary or quinary alloy thereof. The lower contact CONT_INF may also be produced using heterostructures obtained by stacking a plurality of thin layers of preferably III-V semiconductors such as, by way of example, gallium arsenide, indium arsenide, gallium nitride, gallium antimonide, boron phosphide, or a ternary, quaternary or quinary alloy thereof. The lower contact structure CONT_INF consists, by way of example, of an $n^+$-doped wide-bandgap superlattice.

The planar absorbing structure SPA is made of an $n^-$-doped bulk semiconductor (or superlattice heterostructure) having a bandgap narrower than or equal to the bandgap of the lower contact structure. The characteristics of the band diagram of the planar absorbing structure SPA (valence band, conduction band, bandgap) are intrinsic in the case of a bulk material, or effective in that they are a combination of the characteristics of the various thin layers in the case of a superlattice. The planar absorbing structure SPA converts a flux of incident photons with a wavelength z into negative charge carries (electrons) in the (intrinsic or effective) conduction band of the structure SPA and positive charge carriers (holes) in the (intrinsic or effective) valence band of the structure SPA. The semiconductors used to produce the planar absorbing structure SPA (in bulk or superlattice form) may be III-V semiconductors such as, by way of example, gallium arsenide, indium arsenide, gallium nitride, gallium antimonide, boron phosphide, or a ternary, quaternary or quinary alloy thereof. The band structure in the planar absorbing structure SPA is key to increasing the cutoff frequency of the matrix-array detector comprising the pixel Pxl.

The upper contact structure CONT_SUP is made of $p^+$-doped wide-bandgap bulk semiconductors. These semiconductors are preferably III-V semiconductors such as, by way of example, gallium arsenide, indium arsenide, gallium nitride, gallium antimonide, boron phosphide, or a ternary, quaternary or quinary alloy thereof. The lower contact CONT_SUP may also be produced using heterostructures obtained by stacking a plurality of thin layers of preferably III-V semiconductors such as, by way of example, gallium arsenide, indium arsenide, gallium nitride, gallium antimonide, boron phosphide, or a ternary, quaternary or quinary alloy thereof. The upper contact structure CONT_SUP consists, by way of example, of a $n^+$-doped wide-bandgap superlattice.

FIG. 1a illustrates a pixel having a structure obtained via successive deposition and etching operations. The limits of a pixel in the plane (x, y) are thus defined by its three-dimensional structure obtained via the etching operations.

Alternatively, it is possible to produce the same pixel architecture along the pixel axis Δ but with its limits in the plane (x, y) defined by doped regions and not a structure resulting from etching. FIG. 1*b* illustrates a perspective view of a plurality of pixels belonging to a matrix-array detector operating in the infrared frequency domain, the limits of said pixels being defined by the p$^+$-doped regions of the upper contact CONT_SUP. The characteristics of the various portions of each pixel along its axis Δ remain as described with reference to FIG. 1*a*. The main difference is in the way in which the limits of the pixels of the matrix array are defined in the fabricating process used to produce them (etching in 1*a* and doping in 1*b*).

FIG. 1*c* illustrates a cross-sectional view of one prior-art example of an infrared-detecting pixel comprising a planar absorbing structure SPA formed by a superlattice SR0.

The planar absorbing structure SPA is produced, in this illustration, using a periodic heterostructure that forms the superlattice SR0. Generally, the superlattice SR0 is a periodic stack of an elementary group G0 formed by a plurality of thin semiconductor layers. In this example, the elementary group is formed by the first layer C0, which has a thickness e0, and the second layer C'0, which has a thickness e'0. Thus, the period of the superlattice is equal to e0+e'θ. From a quantum point of view, if the layers C0 and C0' are thin enough (between 0.3 nm for one atomic monolayer and 10 nm), a quantum coupling effect is obtained in the various junctions at the interfaces of the layers. This quantum coupling allows the charge carriers (electrons and holes) to access new energy mini-bands. This amounts to obtaining a resultant band diagram different from that of the bulk semiconductors from which the superlattice SR0 is made. In the remainder of the text of this patent application, the band diagram resulting from the association of the thin layers G0=(C0, C'0) forming the superlattice SR0 is designated the "effective band diagram".

The effective band diagram is defined by:
an effective conduction band BC$_{eff}$ having a minimum Ec$_{eff}$;
an effective valence band BV$_{eff}$ having a maximum Ev$_{eff}$;
an effective bandgap Eg$_{eff}$ equal to the difference between the conduction-band minimum Ec$_{eff}$ and the valence-band maximum Ev$_{eff}$.
Generally, use of superlattices in the planar absorbing structures of a pixel makes it possible to achieve cutoff frequencies that are not obtainable with absorbing structures based on bulk semiconductors. Design choices can be made in respect of the planar absorbing structure SPA include, non-limitingly, the composition of the materials used (material engineering), use of a bulk or superlattice structure and the thicknesses of the layers used (structural design of the device). These design choices create possibilities allowing the absorbance of the detector to be controlled, the cutoff frequency of the matrix-array detector to be increased, the quantum efficiency of the pixel to be improved and crosstalk between adjacent pixels to be limited.

The technical solution according to the invention relates to improvement of the performance of matrix-array detectors in the field of infrared imaging (imaging of wavelengths from 1 μm to 70 μm and therefore of the THz domain) and in particular of imaging of SWIR spectra (SWIR standing for Short-Wave InfraRed, 1-2.5 μm). Specifically, prior-art planar focal matrix arrays comprising a planar absorbing structure made of InGaAs possess a very good electro-optical performance but are limited to a cutoff wavelength of 1.7 μm at 300 K. Certain applications, such as gas detection in the space-technology field, or detection of laser sources emitting beyond 1.6 μm, require cutoff wavelength to be increased toward 2-2.5 μm while keeping a certain level of quantum efficiency and of electro-optical performance, to ensure satisfactory detector operation.

One technical problem to be solved in this domain is therefore that of how to design a matrix-array detector operating in the near infrared with a cutoff wavelength longer than 2 μm while improving the internal quantum efficiency of the detector with respect to prior-art solutions.

European patent application EP3482421B1 describes a matrix-array infrared image detector comprising a plurality of pixels. The planar absorbing structure of each pixel in the solution proposed in this patent application is produced using bulk InGaAsSb on a substrate made of GaSb in a specific vertical architecture. In addition, European patent EP1642345B1 describes a matrix-array infrared image detector comprising a plurality of pixels. The planar absorbing structure of each pixel in the solution proposed in this patent is produced using bulk InGaAsSb on a substrate made of GaSb. The drawback of the solutions proposed in these two documents is that the technology of the process for fabricating such a structure on GaSb substrates is complex to execute and entails high production costs as a result of the non-maturity of said process.

The publication "InGaAs/GaAsSb Type-II Superlattices for Short-Wavelength Infrared Detection" by "J. Easley et al." illustrates a second technology, based on a substrate made of InP and a typical vertical detector architecture comprising an InGaAs/GaAsSb superlattice, that allows cutoff wavelengths between 2.1 μm and 2.5 μm to be obtained. However, the existing InGaAs/GaAsSb superlattice does not allow high-performance imagers with a cutoff frequency beyond 2.1 μm to be obtained. Specifically, the thicknesses of the periods of the superlattice are large and result in confinement of holes in the GaAsSb layers and therefore a low quantum efficiency and a mediocre overall performance.

Response to the Problem and Solution Provided

To partially overcome the limitations of existing solutions in respect of increasing cutoff frequency in the SWIR domain to 2.5 μm at non-cryogenic temperatures with a good quantum efficiency, the invention provides a plurality of embodiments of a pixel structure comprising a specific superlattice structure for the planar absorbing structure. More specifically, the invention provides solutions compatible with InP technology, fabricating processes in InP technology having a greater technological maturity than those in other technologies such as GaSb technology. The invention details embodiments with examples of choices of materials for the superlattice, of ranges of compositions for the semiconductor alloys forming the superlattice and of ranges of thicknesses for the layers of the superlattice according to the invention. The elementary group repeated periodically in the superlattice according to the invention consists of at least three thin layer with insertion of an additional narrow-bandgap layer so as to obtain the following advantages over prior-art solutions:
achieving the targeted cutoff wavelengths beyond 2 μm;
decreasing the effective mass of positive charge carriers (holes) by decreasing the potential seen by holes in the wells of the superlattice, inducing an improvement in quantum efficiency; integrability with mature fabricating-process technologies such as technologies based on InP substrates.

SUMMARY OF THE INVENTION

One subject of the invention is a device for detecting infrared radiation comprising at least one pixel. A pixel comprises a first superlattice comprising a stack along a stacking direction of an elementary group of semiconductor layers. The semiconductor layers of said elementary group are each arranged in a crystalline lattice structure of unit cells. Said elementary group comprises:

a first layer made of a first semiconductor having:
    a first bandgap
    and a first conduction-band minimum;
at least a second layer made of a second semiconductor having:
    a second bandgap
    and a second conduction-band minimum strictly lower than the first conduction-band minimum;
a third layer made of a third semiconductor having:
    a third bandgap narrower than the first and second bandgaps
    and a third conduction-band minimum strictly lower than the second conduction-band minimum.

The elementary group is produced in a first stacking configuration in the following order: the second layer, the third layer, the second layer, then the first layer; or in a second stacking configuration such that the third layer is confined between the first and second layers.

According to one particular aspect of the invention, the first semiconductor further has a first valence-band maximum and the second semiconductor further has a second valence-band maximum strictly lower than the first valence-band maximum.

According to one particular aspect of the invention, the first superlattice is produced by epitaxy on a substrate made of a fourth semiconductor arranged in a crystalline lattice structure of unit cells. Said first superlattice is produced such that, for each semiconductor layer of the first superlattice, the lattice of a semiconductor layer undergoes internal mechanical strains to match the lattice of the crystal structure of the substrate.

According to one particular aspect of the invention, the first, second, third and fourth semiconductors are III-V semiconductors.

According to one particular aspect of the invention, the fourth semiconductor is indium phosphide (InP).

According to one particular aspect of the invention, the compositions of the materials used to produce the semiconductor layers of said elementary group are chosen such that the band diagram of the conduction and valence bands in the stacking direction of the first superlattice has an effective bandgap, an effective valence-band maximum and an effective conduction-band minimum. Said effective bandgap is between 400 meV and 750 meV.

According to one particular aspect of the invention, the effective mass of positive charge carriers in the superlattice in the stacking direction is lower than three times the mass of a free electron.

According to one particular aspect of the invention, the third semiconductor is the binary composite InAs.

According to one particular aspect of the invention, the second semiconductor is the ternary alloy $In_xGa_{1-x}As$, with x the mole fraction of indium in the alloy $In_xGa_{1-x}As$.

According to one particular aspect of the invention, the mole fraction x of indium In in the second semiconductor is lower than 0.55.

According to one particular aspect of the invention, the first semiconductor is the ternary alloy $GaAs_ySb_{1-y}$, with y the mole fraction of arsenic in the alloy $GaAs_ySb_{1-y}$.

According to one particular aspect of the invention, the mole fraction y of arsenic As in the first semiconductor is lower than 0.55.

According to one particular aspect of the invention, the ratio between, on the one hand, the sum of the thicknesses of the layers of the elementary group weighted by the amplitude of the strains undergone by each layer, and on the other hand, the total thickness of the elementary group, is lower than or equal to a predetermined value.

According to one particular aspect of the invention, the strains undergone by the lattice of the $In_xGa_{1-x}As$ layer are tensile strains, and the strains undergone by the lattice of the $GaAs_ySb_{1-y}$ layer are compressive strains.

According to one particular aspect of the invention, the amplitude of a strain undergone by the lattice of any one layer of the elementary group is lower than a limiting strain at which dislocation occurs.

According to one particular aspect of the invention, the thickness of a layer of the elementary group is comprised between 0.3 nm and 10 nm.

According to one particular aspect of the invention, a pixel comprises, along the stacking direction (Z), in this order:

the substrate;
a lower contact layer made of an $n^+$-doped fifth semiconductor having:
    a fifth valence-band maximum strictly lower than the effective valence-band maximum of the first superlattice;
    and a fifth bandgap wider than or equal to the effective bandgap of the first superlattice;
a planar absorbing structure comprising at least the first superlattice, the layers of said first superlattice being n-doped;
an upper contact layer made of a $p^+$-doped sixth semiconductor having:
    a sixth valence-band maximum strictly lower than the effective valence-band maximum of the first superlattice;
    and a sixth conduction-band minimum strictly higher than the effective conduction-band minimum of the first superlattice.

According to one particular aspect of the invention, a pixel comprises, along the stacking direction, in this order:

the substrate (SUB);
a lower contact produced using a $n^+$-doped second superlattice having:
    a second effective valence-band maximum strictly lower than the effective valence-band maximum of the first superlattice;
    a second effective bandgap wider than or equal to the effective bandgap of the first superlattice;
a planar absorbing structure comprising at least the superlattice, the layers of said superlattice being n-doped;
an upper contact produced using a third superlattice having:
    a third effective valence-band maximum strictly lower than the effective valence-band maximum of the first superlattice;
    an effective third conduction-band minimum strictly higher than the effective conduction-band maximum of the first superlattice.

According to one particular aspect of the invention, the planar absorbing structure further comprises a transition layer made of an n-doped seventh semiconductor having:

a seventh conduction-band minimum comprised between:
    on the one hand the effective conduction-band minimum of the first superlattice;

and on the other hand the sixth conduction-band minimum or the effective third conduction-band minimum;

a seventh valence-band maximum comprised between:

on the one hand the effective valence-band maximum of the first superlattice;

and on the other hand the sixth valence-band maximum or the third effective valence-band maximum;

the transition layer being confined between the superlattice and the upper contact layer.

BRIEF DESCRIPTION OF THE DRAWINGS

Other features and advantages of the present invention will become more clearly apparent on reading the following description with reference to the following appended drawings.

DETAILED DESCRIPTION

First the notion of growth of a thin layer lattice matched with a substrate will be explained. Generally, a bulk semi-conductor in the solid state is organized in a crystal structure obtained through spatially periodic repetition of an elementary unit cell made up of the atoms of said material. For a given material, its mechanical, physical and electrical characteristics are all determined among other things by the structure of the unit cell and resulting crystal lattice. In the case of a semiconductor alloy, the choice of the mole fractions of the various materials from which the alloy is composed defines the crystal structure and the geometric parameters of the crystal lattice of the obtained alloy.

In the case of detectors of infrared radiation based on thin semiconductor layers, the layers that form the superlattice are fabricated via epitaxial growth on a substrate. It is possible to use molecular beam epitaxy or organometallic vapor-phase epitaxy. In the case of a semiconductor alloy, the choice of the mole fractions used in the step of epitaxial growth of each component of the alloy allows the parameters of the crystal lattice of the deposited layer to be controlled. Thus, through judicious choice of the mole fractions, it is possible to epitaxially deposit a thin layer lattice matched with the crystal structure of the substrate. This is referred to as homoepitaxy.

In the case where the mole fractions used in the alloy deposited on the substrate are different from the values corresponding to a lattice match, it is possible to grow layers of semiconductor alloy of a few nanometers on the substrate—this is referred to as heteroepitaxy. Specifically, the crystal lattice of a deposited layer will undergo internal mechanical strains during the epitaxial growth and match the crystal lattice of the substrate. The internal mechanical strains may be tensile strains or compressive strains, depending on the mole fractions chosen for the alloy. At the scale of the crystal lattice, the internal mechanical strains undergone by the unit cells of the deposited layer engender asymmetries in said unit cells and modifications of the electromagnetic forces between atoms. From an electrical point of view, this modifies the band structure in the deposited layer as detailed below.

Figures 1A, 1B:
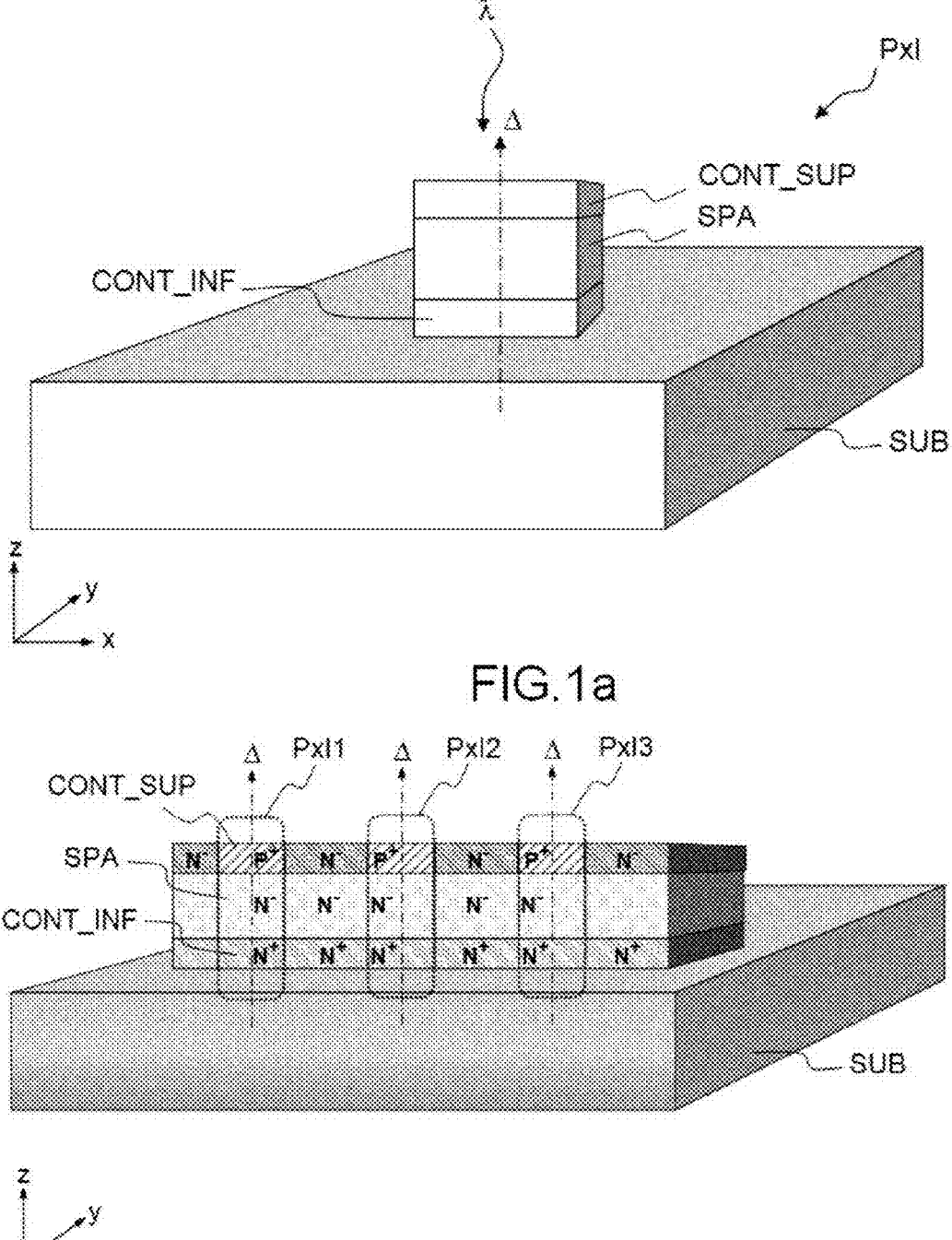
FIG. 1*a* illustrates a perspective view of a first example of a pixel belonging to a matrix-array detector in the infrared frequency domain.
FIG. 1*b* illustrates a perspective view of a second example of a pixel belonging to a matrix-array detector in the infrared frequency domain.
Figure 1C:
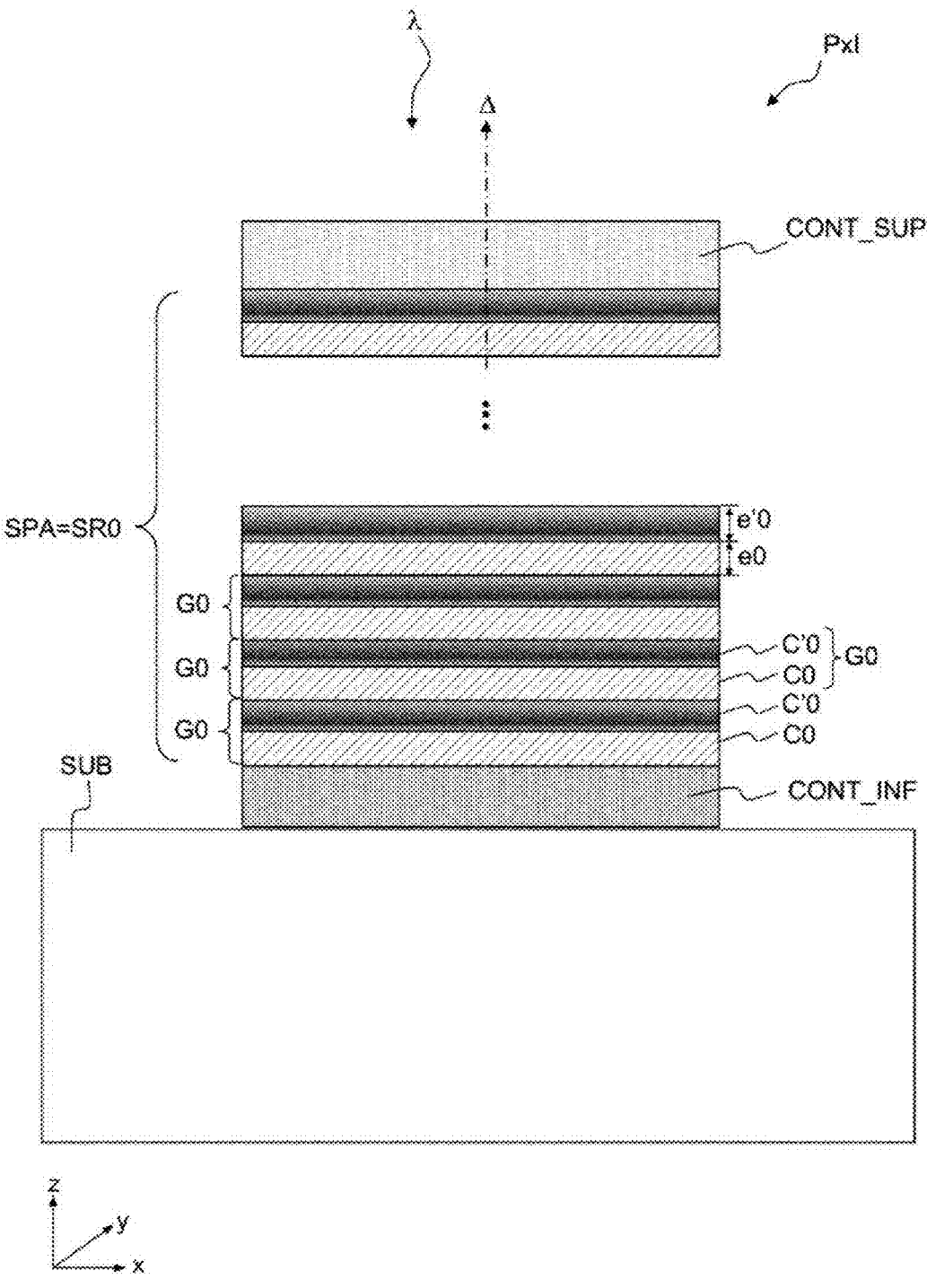
FIG. 1*c* illustrates a cross-sectional view of an example according to the prior art of an infrared-detecting pixel comprising a planar absorbing structure formed by a superlattice.
Figure 1D:
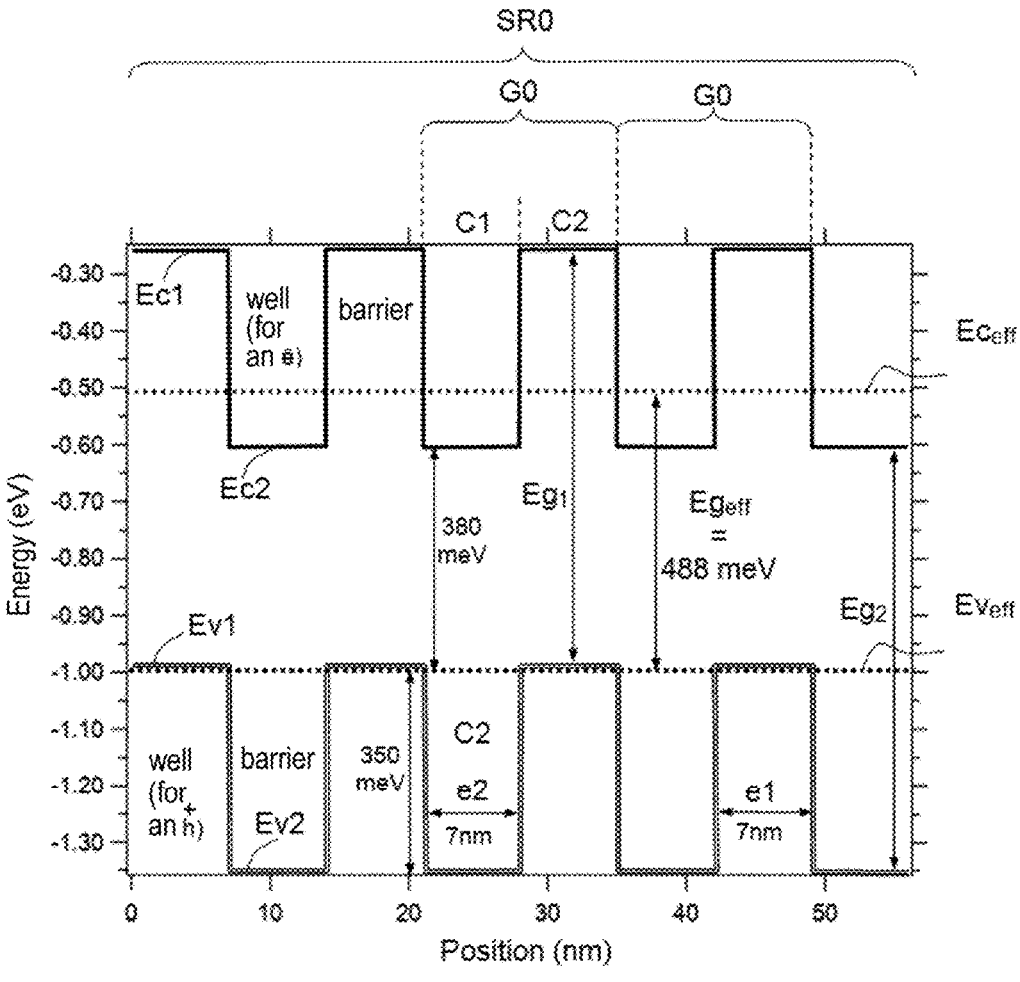
FIG. 1*d* illustrates a diagram of potential along the pixel axis in the superlattice of FIG. 1*c*, the superlattice being obtained by epitaxial growth lattice matched with the substrate.
Figure 1E:
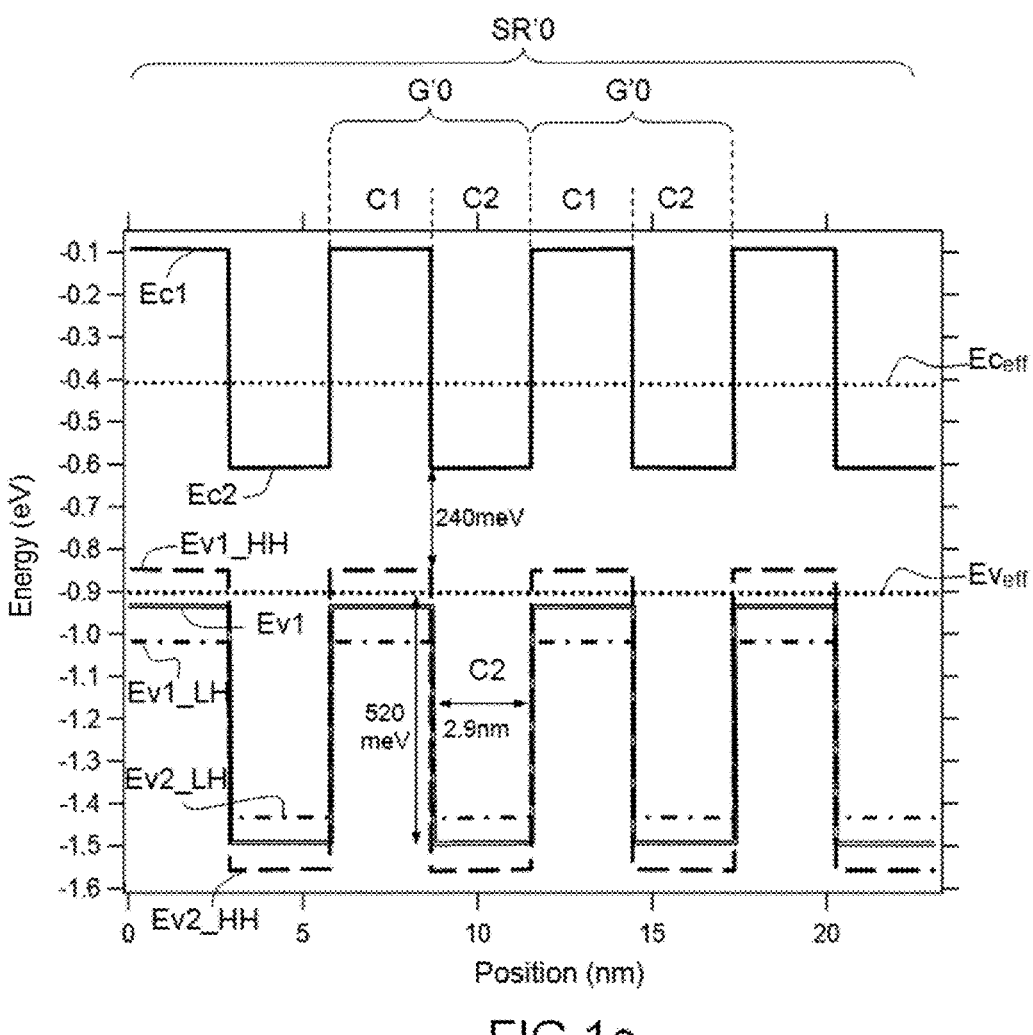
FIG. 1*e* illustrates a diagram of potential along the pixel axis in the superlattice of FIG. 1*c*, the superlattice being obtained by strain-compensated epitaxial growth on a substrate.

The following description of FIGS. 1*d* and 1*e* will allow the limits of use of a bilayer-based superlattice in respect of applications requiring cutoff frequencies beyond 2.1 μm to be detailed. Specifically, producing the planar absorbing structure with a superlattice composed of two layers allows cutoff frequencies in the near infrared beyond 2.1 μm to be achieved, but with a mediocre electro-optical performance. This type of structure has a degraded quantum efficiency and lowers the mobility of positive charge carriers along the pixel axis. This degradation is due to a high effective mass of the holes. This increase in effective mass is explained by the very high potential barrier observed by the holes in the superlattice along the pixel axis. All of these observations and results will be further discussed in the description of FIGS. 1*d* and 1*e*.

FIG. 1*d* illustrates a diagram of potential in the z-direction of the pixel axis in the superlattice SR0 of FIG. 1*c*, the superlattice being obtained by epitaxial growth lattice matched with the substrate.

The diagram of potential of FIG. 1*d* corresponds to a superlattice lattice matched with an InP substrate and an elementary group G0 composed of a first layer C1 made of $GaAs_{y0}Sb_{1-y0}$ and a second layer C2 made of $In_{x0}Ga_{1-x0}As$; $x0=0.53$ is the mole fraction of indium in the $In_{x0}Ga_{1-x0}As$ alloy lattice matched with an InP substrate and $y0=0.52$ is the mole fraction of arsenic in the $GaAs_{y0}Sb_{1-y0}$ alloy lattice matched with an InP substrate. To achieve the cutoff frequency of 2.5 μm, the thickness e1 of the layer C1 made of $GaAs_{y0}Sb_{1-y0}$ is equal to 7 nm and the thickness e2 of the layer C2 made of $In_{x0}Ga_{1-x0}As$ is equal to 7 nm.

The band diagram shows the valence- and conduction-band structure of the various layers of the superlattice in the z-direction of the axis Δ and therefore through the periodic stack of the layers of the superlattice. In the case illustrated, the first layer C1 of the elementary group G0 is produced using the ternary alloy $GaAs_{y0}Sb_{1-y0}$, which has a first bandgap Eg1, a first conduction-band minimum Ec1 and a first valence-band maximum Ev1. The second layer C2 is produced using the ternary alloy $In_{x0}Ga_{1-x0}As$, which has a second bandgap Eg2, a second conduction-band minimum Ec2 and a second valence-band maximum Ev2. The materials from which the superlattice is made are chosen such that Ec1>Ec2 and Ev1>Ev2, to obtain a band diagram of type-II band alignment. From the point of view of positive charge carriers (holes), it is a question of an alternation of potential barriers in the second layers C2 and of potential wells in the first layers C1. From the point of view of negative charge carriers (electrons), it is a question of an alternation of potential barriers in the first layers C1 and of potential wells in the second layers C2.

As indicated above, quantum coupling between the various layers of the superlattice engenders creation of an effective conduction band with an effective minimum $Ec_{eff}$ and of an effective valence band with an effective maximum $Ev_{eff}$. The effective bandgap of the superlattice $Eg_{eff}=Ec_{eff}-Ev_{eff}$ is equal to 0.488 eV. Thus, according to the Planck-Einstein relation, the cutoff frequency $\lambda c = hc/Eg_{eff} \approx 2.5$ μm with h Planck's constant and c the speed of light in free space.

Thus, a superlattice lattice matched with an InP substrate with an elementary group $G0=GaAs_{y0}Sb_{1-y0}/In_{x0}Ga_{1-x0}As$ and thicknesses e1=e2=7 nm allows a cutoff wavelength of 2.5 μm to be obtained. In this case by bandgap overlap what is meant is the difference between the first valence-band maximum Ev1 and the second conduction-band minimum Ec2. The choice of a thickness of 7 nm is required to obtain a bandgap overlap equal to 0.380 eV.

However, the holes in the potential wells in the first layer C1 see a high potential as a result of a combination of the large layer thicknesses (7 nm/7 nm) and of the high potential difference between $Ev_{eff}$ and Ev2 (evaluated to be 0.350 eV). The effect of the potential seen by the holes manifests itself in an increase in the effective mass of heavy holes in the effective valence band, which mass is calculated, in the present combination, to be 71 times the mass of a free electron, which is denoted $m_0$. This corresponds to a decrease in optical efficiency of more than a factor of 10 with respect to a planar absorbing structure having an acceptable optical performance. Generally, an infrared detector delivers an acceptable electro-optical performance if the holes have effective masses lower than 3 times the mass $m_0$ of a free electron.

Table 1 summarizes the results obtained for the various combinations of the superlattice SR0 with $G0=GaAs_{y0}Sb_{1-y0}/In_{x0}Ga_{1-x0}As$ lattice matched with an InP substrate with a view to achieving cutoff wavelengths of 2.1 μm, 2.3 μm and 2.5 μm.

TABLE 1

| λc (μm) | Compositions C1/C2 | Thicknesses e1/e2 (nm) | $Eg_{eff}$ (eV) | Effective mass of the holes along Δ |
|---|---|---|---|---|
| 2.1 | $GaAs_{0.52}Sb_{0.48}/$ $In_{0.53}Ga_{0.47}As$ | 3/3 | 0.580 | $9.8 \times m_0 >$ $3 \times m_0$ |
| 2.3 | $GaAs_{0.52}Sb_{0.48}/$ $In_{0.53}Ga_{0.47}As$ | 5/5 | 0.530 | $52 \times m_0 \gg$ $3 \times m_0$ |
| 2.5 | $GaAs_{0.52}Sb_{0.48}/$ $In_{0.53}Ga_{0.47}As$ | 7/7 | 0.488 | $71.8 \times m_0 \gg$ $3 \times m_0$ |

It has been established from the results shown that a superlattice SR0 with $G0=GaAs_{y0}Sb_{1-y0}/In_{x0}Ga_{1-x0}As$ lattice matched with an InP substrate may achieve cutoff wavelengths beyond 2.1 μm but with an unsatisfactory electro-optical performance and a low quantum efficiency (very high effective hole masses along the pixel axis). Thus the bilayer-based lattice-matched superlattice SR0 with a cutoff frequency of 2.1 μm results in an effective hole mass equal to 9.8 times the mass $m_0$ of a free electron. The bilayer-based lattice-matched superlattice SR0 with a cutoff frequency of 2.3 μm results in an effective hole mass equal to 52 times the mass $m_0$ of a free electron. The bilayer-based lattice-matched superlattice SR0 with a cutoff frequency of 2.5 μm results in an effective hole mass equal to 71.8 times the mass $m_0$ of a free electron.

FIG. 1e illustrates a diagram of potential in the z-direction of the pixel axis in the superlattice SR0 of FIG. 1c, the superlattice being obtained by strain-compensated epitaxial growth on a substrate.

FIG. 1e shows the same superlattice structure SR0 as FIG. 1c but the alloys from which the layers of the superlattice are made have different mole fractions. This change in composition, which is achieved by controlling the balance of the components of the alloy in the epitaxial growth phase, leads to deposition of layers that are not lattice matched with the InP substrate. It has already been explained that this lattice mismatch generates internal mechanical strains in the crystal lattices of the layers C1 and C2, causing them to align with the crystal lattice of the substrate SUB, this resulting in the new band diagram illustrated in FIG. 1d. The superlattice SR'0 in this case is called a "strain-compensated" superlattice.

The band diagram of FIG. 1e corresponds to a strain-compensated superlattice on an InP substrate and with an elementary group G'0 composed of a first layer C1 made of $GaAs_{y'0}Sb_{1-y'0}$ and a second layer C2 made of $In_{x'0}Ga_{1-x'0}As$; x'0=0.25 is the mole fraction of indium in the strain-compensated $In_{x'0}Ga_{1-x'0}As$ alloy on an InP substrate and y'0=0.2 is the mole fraction of arsenic in the strain-compensated $GaAs_{y'0}Sb_{1-y'0}$ on an InP substrate. To achieve the cutoff frequency of 2.5 μm, the thickness e1 of the layer C1 made of $GaAs_{y'0}Sb_{1-y'0}$ may be decreased to 2.9 nm and the thickness e2 of the layer C2 made of $In_{x'0}Ga_{1-x'0}As$ may be decreased to 2.9 nm.

The lattice of the layer C1 made of $GaAs_{y'0}Sb_{1-y'0}$ undergoes compressive strain; the lattice of the layer C2 made of $In_{x'0}Ga_{1-x'0}As$ undergoes tensile strain. The internal strains applied to the lattices of the layers of the superlattice must not exceed a dislocation limit. The sum of the strains undergone by the elementary group G'0 is zero.

The band diagram of FIG. 1e shows the valence- and conduction-band structure along the same axis Δ as in FIG. 1d. It is a question, as explained above, of a band diagram of type-II band alignment, having different maximums and minimums. Specifically, the strain induced by the internal strains undergone by the lattices result in a quantum effect known as "degeneracy lifting". Degeneracy lifting consists in a separation of the energy levels occupied by heavy holes and light holes. Thus, in the first layers C1 and second layers C2, a difference is observed between the valence-band maximum occupied by the heavy holes, which is denoted Ev1-HH in the first layers and Ev2-HH in the second layers, and the valence-band maximum occupied by the light holes, which is denoted Ev1-LH in the first layers and Ev2-LH in the second layers. In addition, the position of the conduction band and of the valence bands is modified under the effect of the strain. When it is a question of a tensile strain, bandgap decreases (conduction-band minimum decreases and valence-band maximum increases). When it is a question of a compressive strain, bandgap increases (conduction-band minimum increases and valence-band maximum decreases). This makes it possible to decrease bandgap overlap to 240 meV, allowing the thickness of the first layer C1 and the thickness of the second layer C2 to be decreased to 2.9 nm.

Quantum coupling between the various layers of the superlattice leads to creation of an effective conduction band with an effective conduction-band minimum $Ec_{eff}$ and of an effective valence band with an effective valence-band maximum $Ev_{eff}$. The effective superlattice bandgap $Eg_{eff}=Ec_{eff}-Ev_{eff}$ is equal to 0.492 eV. Thus, according to the Planck-Einstein relation, the cutoff frequency $\lambda c=hc/Eg_{eff}\approx 2.5$ μm with h Planck's constant and c the speed of light in free space.

Thus, a strain-compensated superlattice lattice SR'0 on an InP substrate with an elementary group $G0=GaAs_{y'0}Sb_{1-y'0}/In_{x'0}Ga_{1-x'0}As$ and thicknesses e1=e2=2.9 nm allows a cutoff wavelength of 2.5 μm to be obtained. However, the holes in the potential wells in C1 still see a high potential as a result of a combination of the large layer thicknesses (2.9 nm/2.9 nm) and of the high potential difference between $Ev_{eff}$ and Ev2 (evaluated to be 0.520 eV). The effect of the potential seen by the holes manifests itself in an increase in the effective mass of heavy holes in the effective valence band, which mass is calculated, in the present combination, to be 24 times the mass of a free electron.

Table 2 summarizes the results obtained for the various combinations of the strain-compensated superlattice SR'0 with $G'0=GaAs_{y'0}Sb_{1-y'0}/In_{x'0}Ga_{1-x'0}As$ on an InP substrate with a view to achieving cutoff wavelengths of 2.1 μm, 2.3 μm and 2.5 μm at an operating temperature of 300 K.

TABLE 2

| $\lambda c$ (μm) | Compositions C1/C2 | Thicknesses e1/e2 (nm) | $Eg_{eff}$ (eV) | Effective mass of the holes along $\Delta$ |
|---|---|---|---|---|
| 2.1 | $GaAs_{0.2}Sb_{0.8}/In_{0.25}Ga_{0.75}As$ | 1.3/1.3 | 0.587 | $1.2 \times m_0 < 3 \times m_0$ |
| 2.3 | $GaAs_{0.2}Sb_{0.8}/In_{0.25}Ga_{0.75}As$ | 2.1/2.1 | 0.535 | $6 \times m_0 > 3 \times m_0$ |
| 2.5 | $GaAs_{0.2}Sb_{0.8}/In_{0.25}Ga_{0.75}As$ | 2.9/2.9 | 0.492 | $24 \times m_0 > 3 \times m_0$ |

It has been established from the results shown that a strain-compensated superlattice SR'0 with $G'0=GaAs_{y'0}Sb_{1-y'0}/In_{x'0}Ga_{1-x'0}As$ on an InP substrate may achieve cutoff wavelengths beyond 2.1 μm but with an unsatisfactory electro-optical performance and a low quantum efficiency (very high effective hole masses along the pixel axis). Thus, the bilayer-based strain-compensated superlattice SR'0 with a cutoff frequency of 2.1 μm results in an effective hole mass equal to 1.2 times the mass $m_0$ of a free electron. The bilayer-based strain-compensated superlattice SR'0 with a cutoff frequency of 2.3 μm results in an effective hole mass equal to 6 times the mass $m_0$ of a free electron. The bilayer-based strain-compensated superlattice SR'0 with a cutoff frequency of 2.5 μm results in an effective hole mass equal to 24 times the mass $m_0$ of a free electron. An improvement with respect to the lattice-matched superlattice SR0 is observed, but this improvement remains insufficient and most particular for the cutoff wavelengths of 2.3 μm and 2.5 μm. In the above passages the limits of using a bilayer-based superlattice to produce a planar absorbing structure SPA of a pixel Pxl belonging to an infrared detector operating with a cutoff frequency in the upper part of the SWIR at non-cryogenic temperatures has been demonstrated. The invention provides a new superlattice structure allowing the limits in respect of cutoff frequencies between 2.1 μm and 2.5 μm of bilayer-based superlattice structures to be overcome with a good quantum efficiency achieved by decreasing effective hole mass.

Figure 2A:
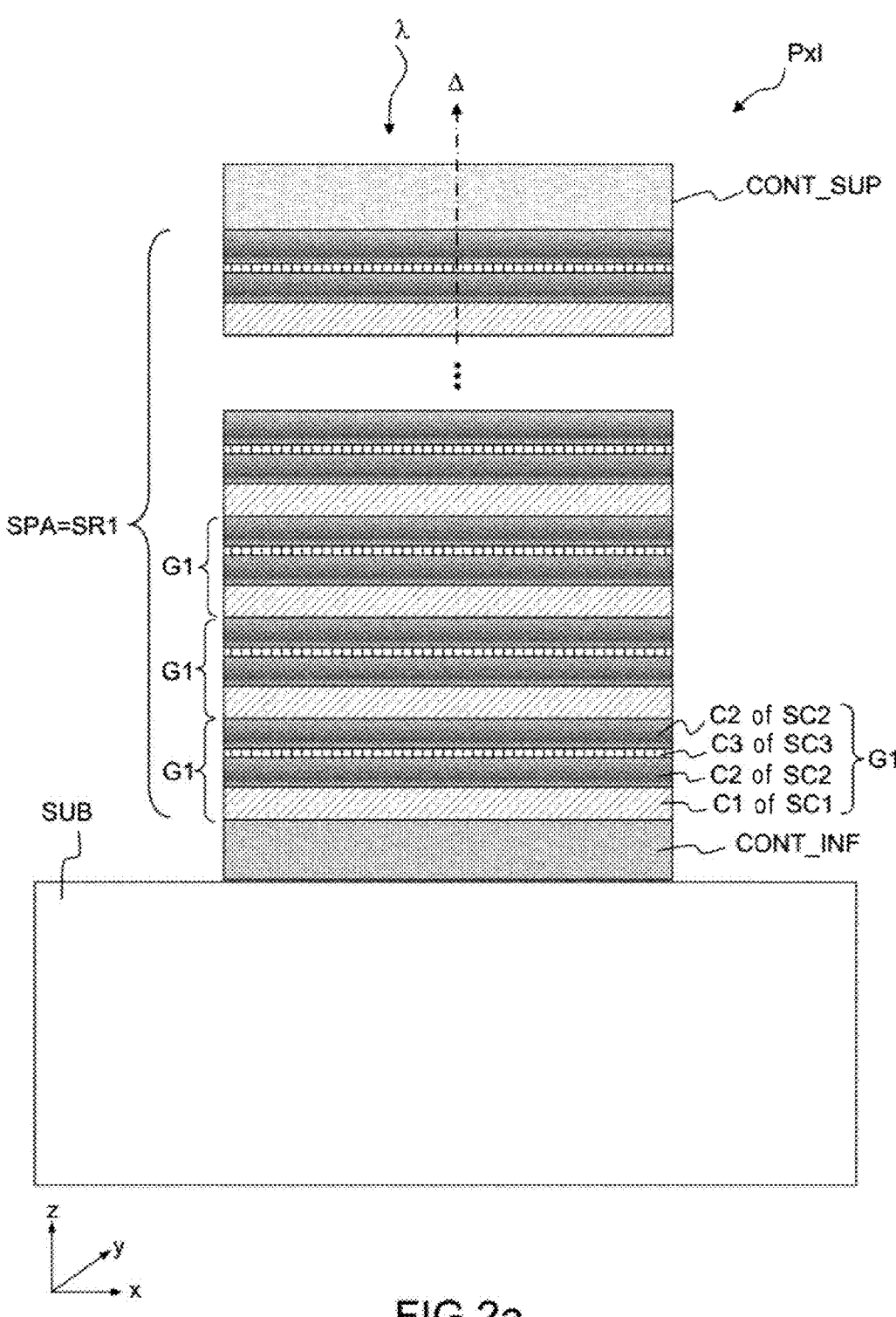
FIG. 2*a* illustrates a cross-sectional view of an infrared-detecting pixel comprising a superlattice according to a first embodiment of the invention.

FIG. 2a illustrates a cross-sectional view of an infrared-detector pixel comprising a superlattice according to a first embodiment of the invention.

Figure 2B:
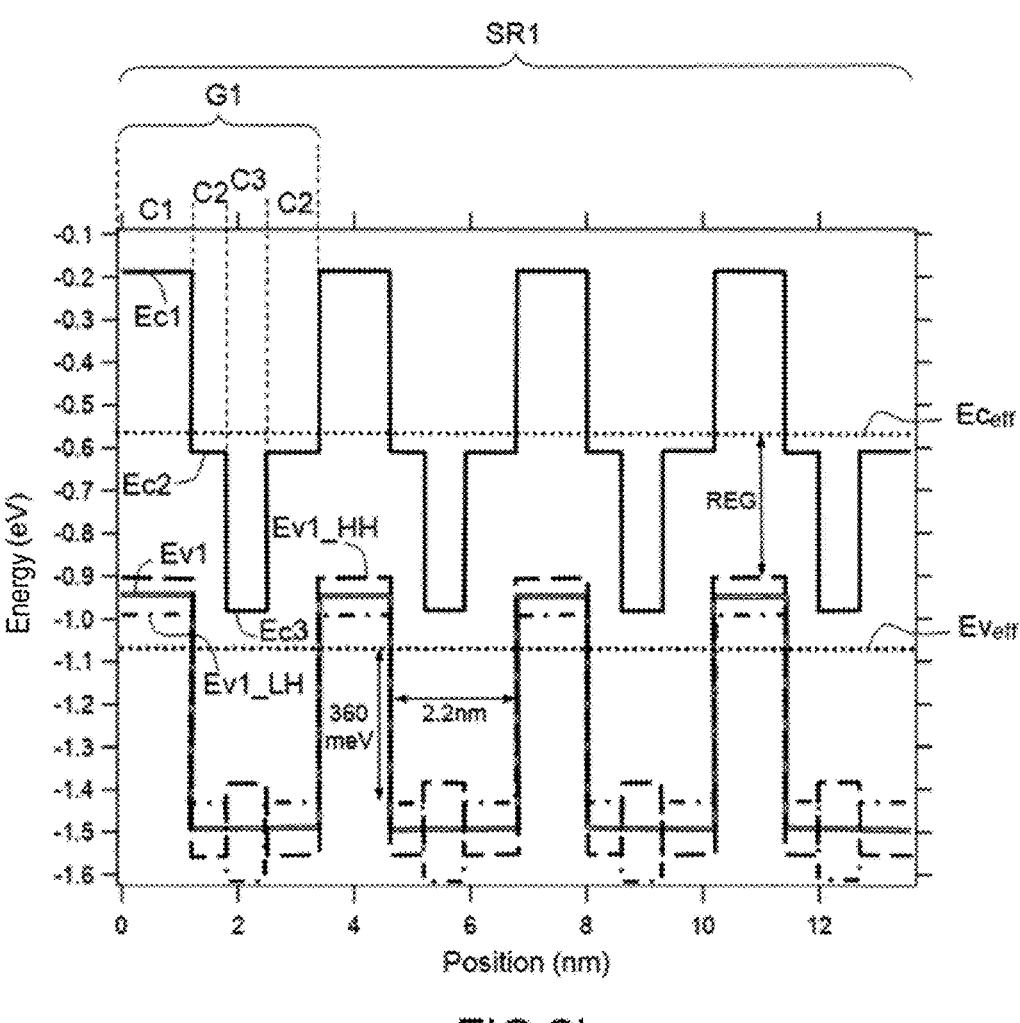
FIG. 2*b* illustrates a diagram of potential along the pixel axis in the superlattice according to the first embodiment of the invention.

FIG. 2b illustrates a diagram of potential in the z-direction of the pixel axis in the superlattice according to the first embodiment of the invention, the superlattice being obtained by strain-compensated epitaxial growth on a substrate SUB.

The pixel Pxl comprises a superlattice SR1 comprising a stack along the pixel axis $\Delta$ of an elementary group G1 of semiconductor layers. The semiconductor layers of said elementary group G1 are strain-compensated. The periodically repeated elementary group G1 comprises, in this order:

a first layer C1 made of a first semiconductor SC1;
a second layer C2 made of a second semiconductor SC2;
a third layer C3 made of a third semiconductor SC3;
a layer C'2 having the same composition as the layer C2 but possibly having a different thickness e'2.

The first embodiment thus corresponds to a superlattice SR1 based on the following elementary group: G1=(C1/C2/C3/C'2).

The first semiconductor SC1 of the layer C1 has a first bandgap Eg1, a first valence-band maximum Ev1 and a first conduction-band minimum Ec1.

The second semiconductor SC2 of the layer C2 has a second bandgap Eg2, a second valence-band maximum Ev2 lower than the first valence-band maximum Ev1 and a second conduction-band minimum Ec2 lower than the first conduction-band minimum Ec1.

The third semiconductor SC3 of C3 has a third bandgap Eg3 strictly narrower than the first and second bandgaps Eg1 and Eg2 and a third conduction-band minimum Ec3 lower than the second conduction-band minimum Ec2. Generally, insertion of the third layer C3 of a narrow-bandgap semiconductor SC3 into the superlattice allows bandgap overlap REG to be decreased. The decrease in bandgap overlap REG makes it possible to opt to decrease the total thickness of the elementary group G1 in the domain of the targeted cutoff wavelengths. The decrease in the thickness of the elementary group G1 allows the potential barrier seen by the holes confined in the potential wells to be decreased and thus their effective mass to be decreased, increasing quantum efficiency and the mobility of the positive charge carriers.

The first layer C1 is compressively strained, the second layer C2 is tensilely strained and the third layer C3 is compressively strained. The sum of the strains undergone by an elementary group $G1=(C1/C2/C3/C'2)$ is zero.

By way of example, and without loss of generality, it is possible to produce the superlattice SR1 according to the first embodiment via a stack of a plurality of thin semiconductor layers, and preferably of layers of III-V semiconductors such as, by way of example, gallium arsenide, indium arsenide, gallium nitride, gallium antimonide, boron phosphide, or a ternary, quaternary or quinary alloy thereof. To illustrate this embodiment, FIG. 2b specifically illustrates the band diagram obtained with the superlattice SR1, with the following dimensional characteristics and compositions.

In the example of FIG. 2b, the targeted cutoff wavelength is 2.5 μm. To obtain this cutoff wavelength, the materials from which the superlattice according to the first embodiment is made are as follows: the first layer C1 is produced using the ternary alloy $GaAs_{y1}Sb_{1-y1}$ with a mole fraction of arsenic y1=0.35 and a thickness e1=1.2 nm; the second layer C2 is produced using the ternary alloy $In_{x1}Ga_{1-x1}As$ with a mole fraction of indium x1=0.25 and a thickness e2=0.6 nm in its first instance (C2) in the elementary group and e'2=0.9 nm in its second instance (C'2) in the elementary group G1. The third layer C3 inserted between the two layers (C2, C'2) is produced using indium arsenide InAs, a binary composite III-V semiconductor with a narrow bandgap. The thickness of the third layer C3, which is denoted e3, is equal to 0.7 nm.

The effect of insertion of the layer C3 made of InAs combined with strain-compensated growth, which will split the heavy-hole and light-hole levels, may be seen in the band diagram of FIG. 2b. The obtained effect consists in a decrease in the bandgap overlap REG and therefore in the ability to use thicknesses e1, e2 and e3 of the order of 1 nm for each layer. In this case, the bandgap overlap is effective and it corresponds to a combination of the bandgap overlaps of the various component layers of the superlattice. Thus, a pixel with an effective bandgap $Eg_{eff}=Ec_{eff}-Ev_{eff}$ equal to 0.493 eV ($Ac=hc/Eg_{eff}≈2.5$ μm) is obtained with an elementary group G1 of total thickness of 2.2 nm, and a low potential difference between $Ev_{eff}$ and Ev2 (evaluated to be 0.360 eV). The decrease in these two characteristics allows the potential barrier of the wells (layer C1) in the superlattice SR1 to be lowered, as seen by the holes. The effective mass of the holes is decreased to 2.8 times the mass of a free electron for a cutoff wavelength of 2.5 μm.

Table 3 summarizes the results obtained for the various combinations of the strain-compensated superlattice SR1 according to the first embodiment with $G1=GaAs_{y1}Sb_{1-y1}/In_{x1}Ga_{1-x1}As/InAs/In_{x1}Ga_{1-x1}As$ on an InP substrate with a view to achieving cutoff wavelengths of 2.1 μm, 2.3 μm and 2.5 μm at an operating temperature of 300 K.

TABLE 3

| λc (μm) | Compositions C1/C2 | Thicknesses e1/e2/e3/e'2 (nm) | $Eg_{eff}$ (eV) | Effective mass of the holes along Δ |
|---|---|---|---|---|
| 2.1 | $GaAs_{0.4}Sb_{0.6}/$ $In_{0.35}Ga_{0.65}As/InAs/$ $In_{0.35}Ga_{0.65}As$ | 0.9/0.6/0.3/0.6 | 0.580 | $0.89 \times m_0 < 3 \times m_0$ |
| 2.3 | $GaAs_{0.35}Sb_{0.65}/$ $In_{0.25}Ga_{0.75}As/InAs/$ $In_{0.25}Ga_{0.75}As$ | 0.9/0.6/0.5/0.6 | 0.537 | $1.2 \times m_0 < 3 \times m_0$ |
| 2.5 | $GaAs_{0.35}Sb_{0.65}/$ $In_{0.25}Ga_{0.75}As/InAs/$ $In_{0.25}Ga_{0.75}As$ | 1.2/0.6/0.7/0.9 | 0.493 | $2.8 \times m_0 < 3 \times m_0$ |

It has been established from the results shown that a strain-compensated superlattice SR1 with $G1=GaAs_{y1}Sb_{1-y1}/In_{x1}Ga_{1-x1}As/InAs/In_{x1}Ga_{1-x1}As$ on an InP substrate may achieve cutoff wavelengths beyond 2.1 μm with an improved electro-optical performance and a higher quantum efficiency (effective hole masses along the pixel axis lower with respect to the results obtained with a planar absorbing structure formed using a bilayer-based superlattice). Thus the superlattice SR1 according to the first embodiment with a cutoff frequency of 2.1 μm results in an effective hole mass equal to 0.89 times the mass $m_a$ of a free electron (compared to $2.1 \times m_0$ for SR'0 and $9.8 \times m_0$ for SR0). The superlattice SR1 according to the first embodiment with a cutoff frequency of 2.3 μm results in an effective hole mass equal to 1.2 times the mass $m_o$ of a free electron (compared to $6 \times m_0$ for SR'0 and $52 \times m_0$ for SR0). The superlattice SR1 according to the first embodiment with a cutoff frequency of 2.5 μm results in an effective hole mass equal to 2.8 times the mass $m_o$ of a free electron (compared to $24 \times m_0$ for SR'0 and $71.8 \times m_0$ for SR0). Generally, insertion of a thin layer made of a narrow-bandgap semiconductor into the elementary group of the superlattice between two layers C2 allows the effective mass of holes in the potential wells to be decreased. The obtained values are quite close to those of bulk materials and allow a good internal quantum efficiency to be obtained for wavelengths between 2.1 μm and 2.5 μm at non-cryogenic temperatures. The elementary group $G1=(C1/C2/C3/C2)$ of the superlattice SR1 according to the first embodiment may be produced using a first layer C1 made of $GaAs_ySb_{1-y}$ and a mole fraction of arsenic y lower than $y_{max}=0.55$; and a second layer C2 made of $In_xGa_{1-x}As$ and a mole fraction of indium x lower than $x_{max}=0.55$.

The maximum mole-fraction limit $y_{max}=0.55$ is due to inversion of the strain from compressive to tensile for values beyond $y_{match}=0.52$, which is the mole fraction y of arsenic in $GaAs_ySb_{1-y}$ corresponding to a lattice match on an InP substrate. The inversion of the strain from compressive to tensile increases bandgap overlap and therefore decreases cutoff wavelength. It is tolerable to exceed this limit up to $y_{max}=0.55$ because the effect of the inversion is small and operation with a cutoff frequency between 2.1 μm and 2.5 μm at non-cryogenic temperatures is still achievable below $y_{max}=0.55$.

The maximum mole-fraction limit $x_{max}=0.55$ is due to inversion of the strain from tensile to compressive for values beyond $x_{match}=0.53$, which is the mole fraction x of indium in $In_xGa_{1-x}As$ corresponding to a lattice match on an InP substrate. The inversion of the strain from tensile to compressive increases bandgap overlap and therefore decreases cutoff wavelength. It is tolerable to exceed this limit up to $x_{max}=0.55$ because the effect of the inversion is small and operation with a cutoff frequency between 2.1 μm and 2.5 μm at non-cryogenic temperatures is still achievable below $x_{max}=0.55$.

Choosing these mole fractions for the alloys used to produce the superlattice allows strains to be applied to the lattices of the crystal structure of the layers of the superlattice so as to decrease the potential barrier seen by the holes while remaining below the limiting strains at which dislocations, which weaken the mechanical structure of the device, occur. The strains and thicknesses of each layer C1, C2 and C3 of the elementary group G1 must respect the following inequality to avoid dislocation effects:

$$\frac{\sum_i e_i \cdot c_i}{\sum_i e_i} \leq 4000 \text{ ppm}$$

with $e_i$ the thickness of the $i^{th}$ layer $C_i$ of the elementary group G1, and $c_i$ the strain undergone by the lattice of the $i^{th}$ layer $C_i$ of the elementary group G1.

Figure 3A:
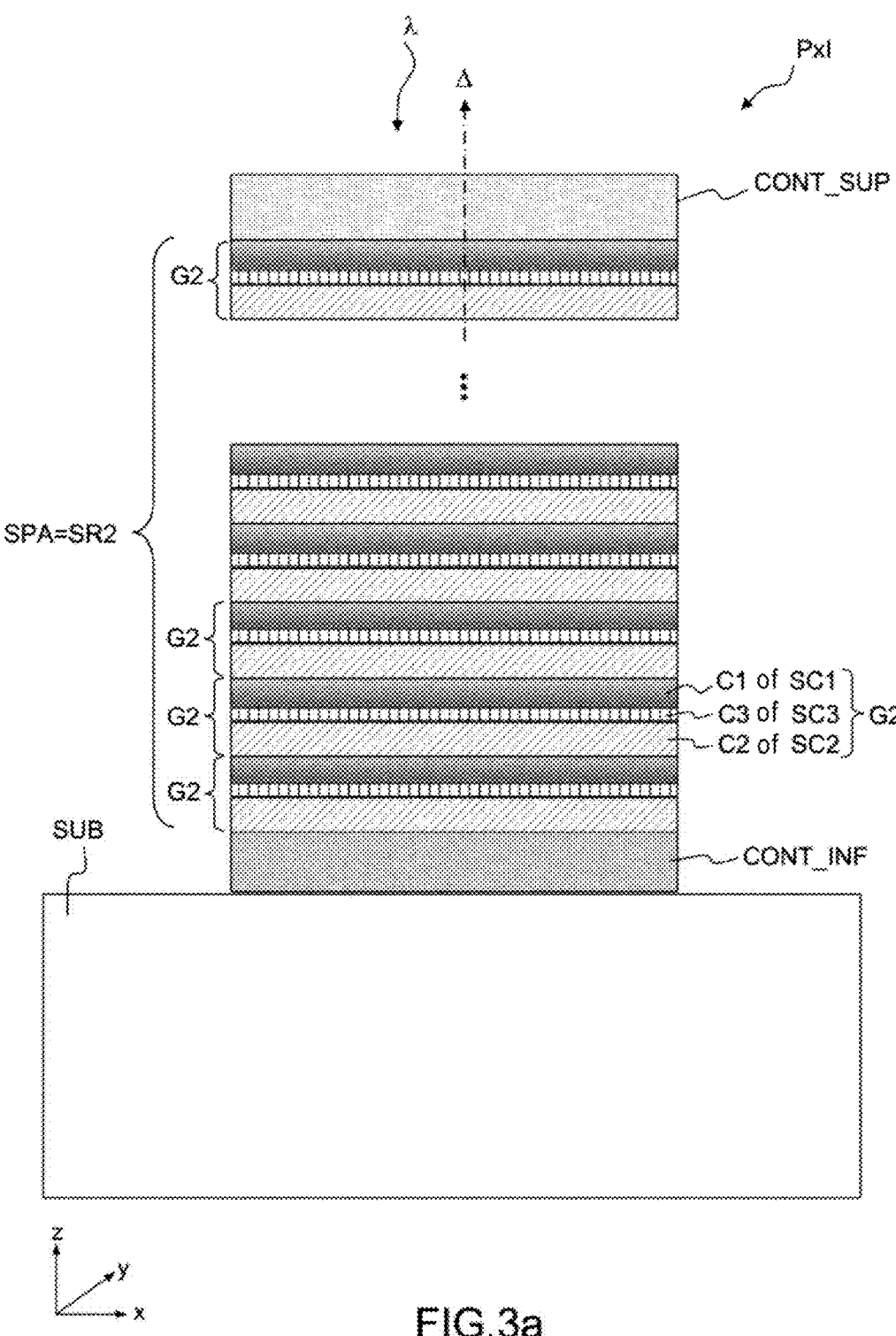
FIG. 3*a* illustrates a cross-sectional view of an infrared-detecting pixel comprising a superlattice according to a second embodiment of the invention.

FIG. 3a illustrates a cross-sectional view of an infrared-detecting pixel comprising a superlattice according to a second embodiment of the invention.

Figure 3B:
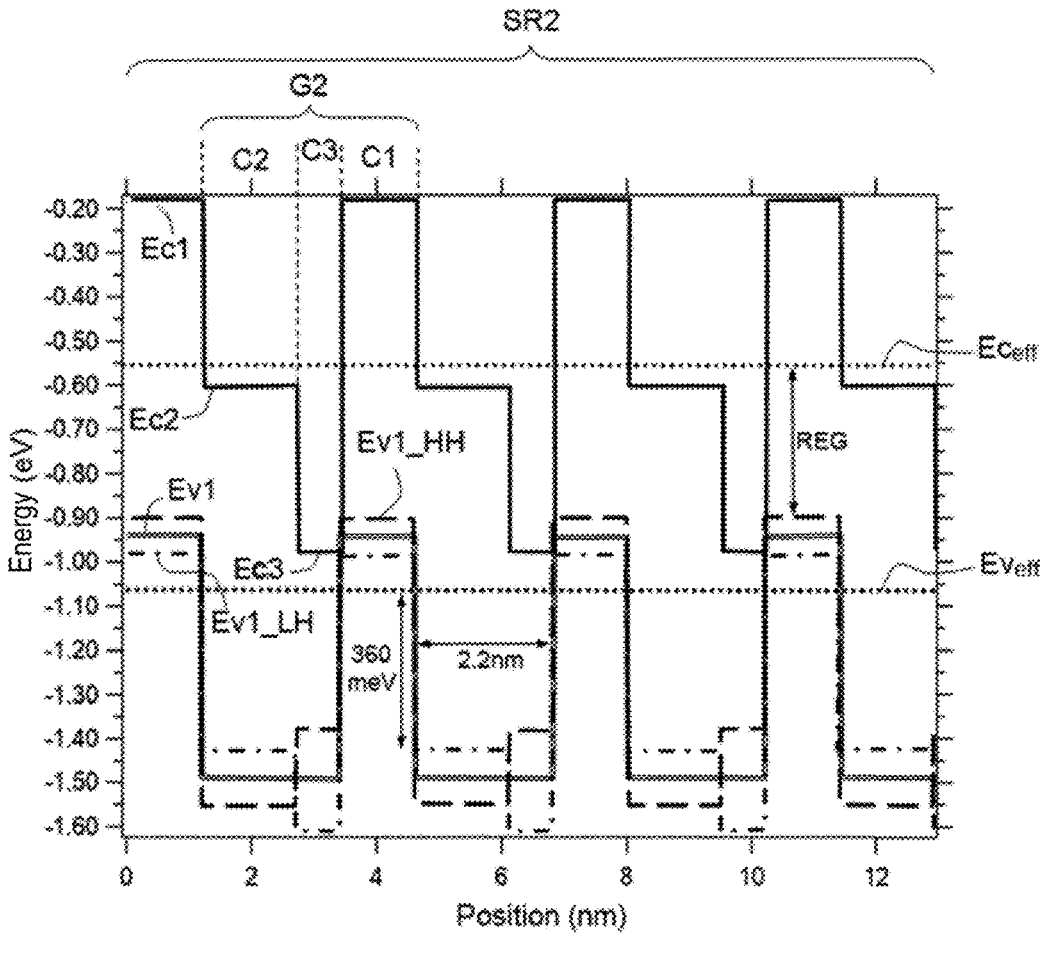
FIG. 3*b* illustrates a diagram of potential along the pixel axis in the superlattice according to the second embodiment of the invention.

FIG. 3b illustrates a diagram of potential in the z-direction of the pixel axis in the superlattice according to the second embodiment of the invention, the superlattice being obtained by strain-compensated epitaxial growth on a substrate SUB.

The pixel Pxl comprises a superlattice SR2 comprising a stack along the pixel axis Δ of an elementary group G2 of semiconductor layers. The semiconductor layers of said elementary group G2 are strain-compensated. The periodically repeated elementary group G2 comprises, in this order:

the second layer C2 made of a second semiconductor SC2 having the same characteristics (in terms of intrinsic-band distribution) as the second semiconductor used in the first embodiment described above;

the third layer C3 made of a third semiconductor SC3 having the same characteristics (in terms of intrinsic-band distribution) as the third semiconductor used in the first embodiment described above;

the first layer C1 made of a first semiconductor SC1 having the same characteristics (in terms of intrinsic-band distribution) as the first semiconductor used in the first embodiment described above.

The second embodiment thus corresponds to a superlattice SR2 based on the following elementary group: G2=(C2/C3/C1).

The first layer C1 is compressively strained, the second layer C2 is tensilely strained and the third layer C3 is compressively strained. The sum of the strains undergone by an elementary group G2=(C2/C3/C1) is zero.

By way of example, and without loss of generality, it is possible to produce the superlattice SR2 according to the second embodiment via a stack of a plurality of thin semiconductor layers, and preferably of layers of III-V semiconductors such as, by way of example, gallium arsenide, indium arsenide, gallium nitride, gallium antimonide, boron phosphide, or a ternary, quaternary or quinary alloy thereof. To illustrate this embodiment, FIG. 3b specifically illustrates the band diagram obtained with the superlattice SR2, with the following dimensional characteristics and compositions.

In the example of FIG. 3b, the targeted cutoff wavelength is 2.5 μm. The first layer C1 is produced using the ternary alloy $GaAs_{y1}Sb_{1-y1}$ with a mole fraction of arsenic $y1=0.35$ and a thickness $e1=1.2$ nm. The second layer C2 is produced using the ternary alloy $In_{x1}Ga_{1-x1}As$ with a mole fraction of indium $x1=0.25$ and a thickness $e2=1.5$ nm. The third layer C3 inserted between the layers C2 and C1 is produced using indium arsenide InAs, a binary composite III-V semiconductor with a narrow bandgap. The thickness of the third layer C3, which is denoted e3, is equal to 0.7 nm.

As explained above, the effect of insertion of the layer C3 made of InAs combined with strain-compensated growth, which will split the heavy-hole and light-hole levels, may be seen in the band diagram of FIG. 3b. The obtained effect consists in a decrease in the bandgap overlap and therefore in the ability to use thicknesses e1, e2 and e3 of the order of 1 nm for each layer. In this case, the bandgap overlap is effective and it corresponds to a combination of the bandgap overlaps of the various component layers of the superlattice. Thus, a pixel with an effective bandgap $Eg_{eff}=Ec_{eff}-Ev_{eff}$ equal to 0.49 eV ($\lambda c=hc/Eg_{eff}\approx2.5$ μm) is obtained with an elementary group G2 of total thickness of 2.2 nm, and a low potential difference between $Ev_{eff}$ and Ev2 (evaluated to be 0.360 eV). The decrease in these two characteristics allows the potential barrier of the wells (layer C1) in the superlattice SR2 to be lowered, as seen by the holes. The effective mass of the holes is decreased to 2.8 times the mass of a free electron for a cutoff wavelength of 2.5 μm.

The strain-compensated superlattice SR2 according to the second embodiment of the invention with $G2=In_{x1}Ga_{1-x1}As/InAs/GaAs_{y1}Sb_{1-y1}$ on an InP substrate may achieve cutoff wavelengths beyond 2.1 μm with an improved electro-optical performance and a higher quantum efficiency (effective hole masses along the pixel axis lower with respect to the results obtained with a planar absorbing structure formed using a bilayer-based superlattice).

More generally, insertion of a thin layer made of a narrow-bandgap semiconductor into the elementary group of the superlattice allows the effective mass of holes in the potential wells to be decreased. The obtained values are quite close to those of bulk materials and allow a good internal quantum efficiency to be obtained for wavelengths between 2.1 μm and 2.5 μm at non-cryogenic temperatures. The elementary group G2=(C2/C3/C1) of the superlattice SR2 according to the second embodiment may be produced using a first layer C1 made of $GaAs_ySb_{1-y}$ and a mole fraction of arsenic y lower than 0.55; and a second layer C2 made of $In_xGa_{1-x}As$ and mole fraction of indium x lower than $x_{max}=0.55$. The explanations given above regarding the choices made in respect of the mole fractions also apply to this architecture. Choosing these mole fractions for the alloys used to produce the superlattice allows strains to be applied to the lattices of the crystal structure of the layers of the superlattice so as to decrease the potential barrier seen by the holes while remaining below the limiting strains at which dislocations, which weaken the mechanical structure of the device, occur. The strains and thicknesses of each layer C1, C2 and C3 of the elementary group G2 must respect the following inequality to avoid dislocation effects:

$$\frac{\sum_i e_i \cdot c_i}{\sum_i e_i} \leq 4000 \text{ ppm}$$

with $e_i$ the thickness of the $i^{th}$ layer $C_1$ of the elementary group G2, and cl the strain undergone by the lattice of the $i^{th}$ layer $C_1$ of the elementary group G2.

Generally, during the epitaxial growth operation, the compositions of the materials used to produce the semiconductor layers of the elementary group G1 (or G2) are chosen such that the conduction and valence band diagram in the stacking direction of the superlattice SR1 (or SR2) has an effective bandgap $Eg_{eff}$ between 400 meV and 750 meV, to obtain a detector device having a cutoff frequency ($\lambda_c$) between 1.6 μm and 3.1 μm.

Figure 4:
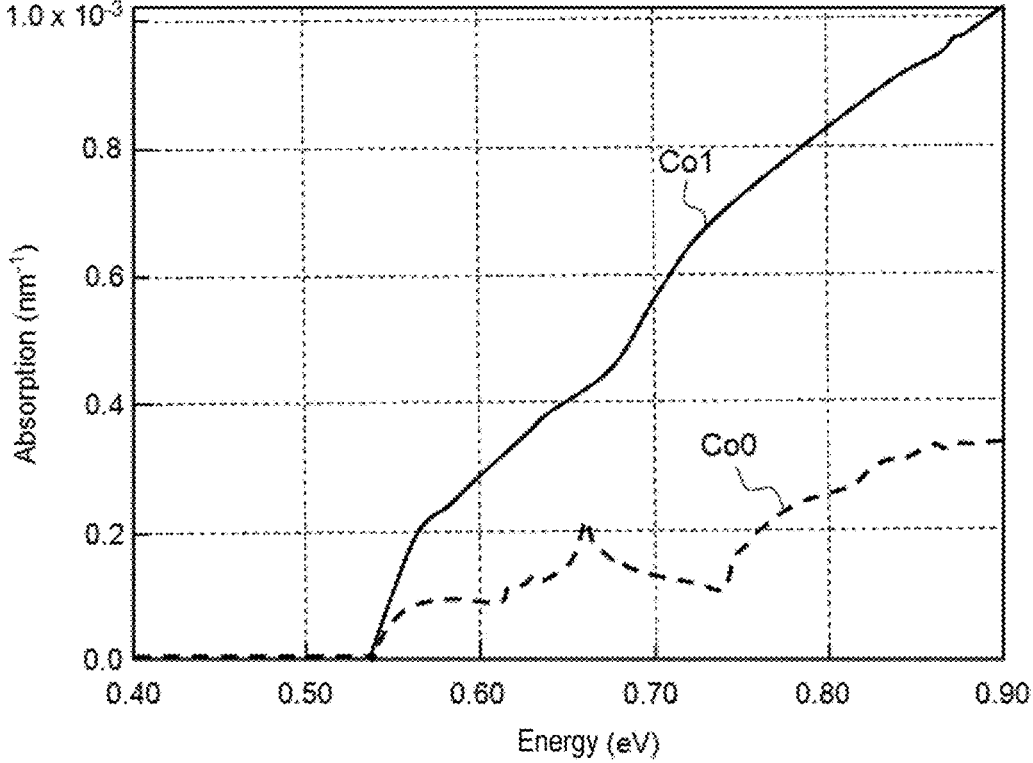
FIG. 4 illustrates curves of the results of simulation of absorption for a bilayer-based superlattice and a superlattice according to the second embodiment of the invention for a cutoff wavelength equal to 2.3 μm.

FIG. 4 illustrates curves of the results of simulation of absorption for a prior-art superlattice and a superlattice according to the second embodiment of the invention, for a cutoff wavelength of 2.3 μm.

The absorbed energy of 0.54 eV corresponds to a cutoff wavelength of 2.3 μm. Here, the advantage of the planar absorbing structure SPA based on a superlattice according to the invention with respect to the solution with a superlattice having a bilayer elementary group is demonstrated. By way of example, for an incident wavelength of 2 μm (equivalent to 0.6 eV) the solution according to the invention exhibits an absorption of the incident wave three times higher than that of a superlattice having a bilayer elementary group.

Figure 5A:
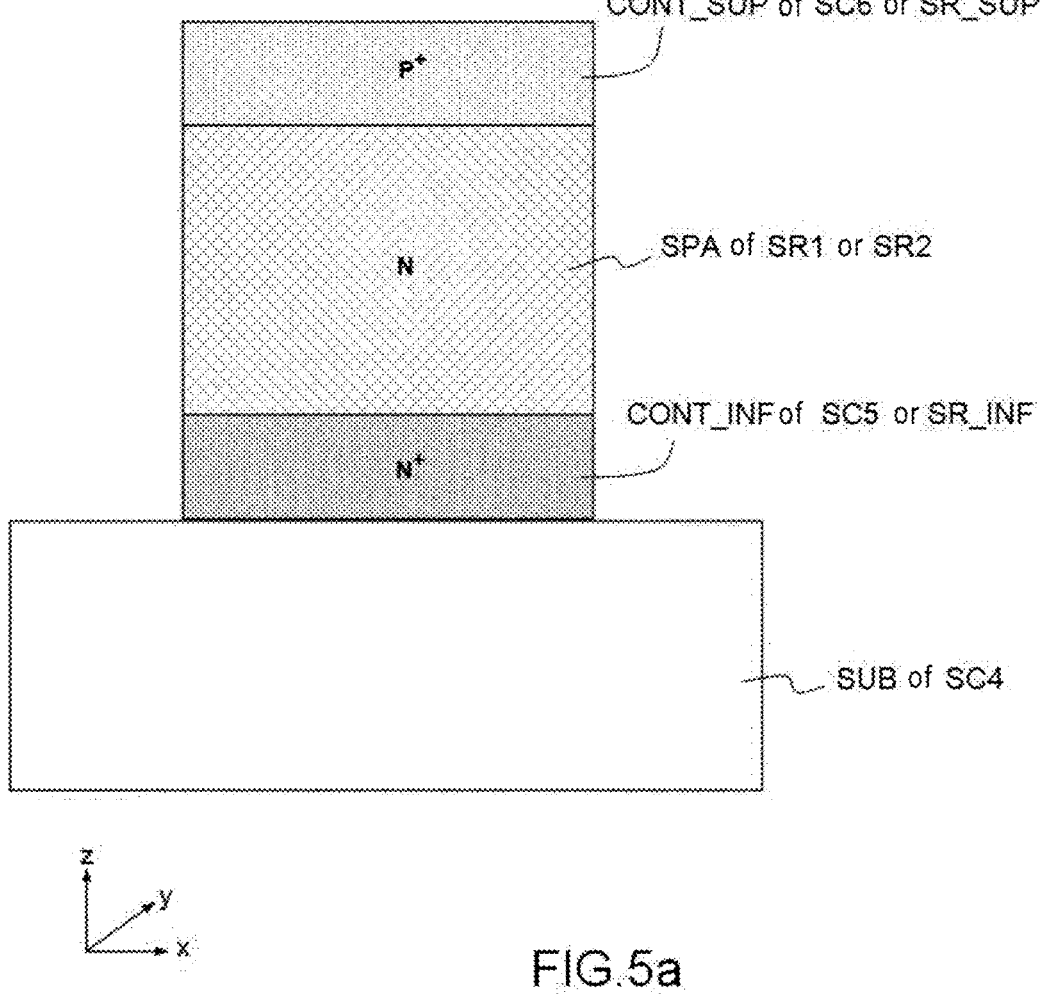
FIG. 5*a* illustrates a cross-sectional view of a first example of a pixel comprising a planar absorbing structure according to any one of the embodiments of the invention.
Figure 5B:
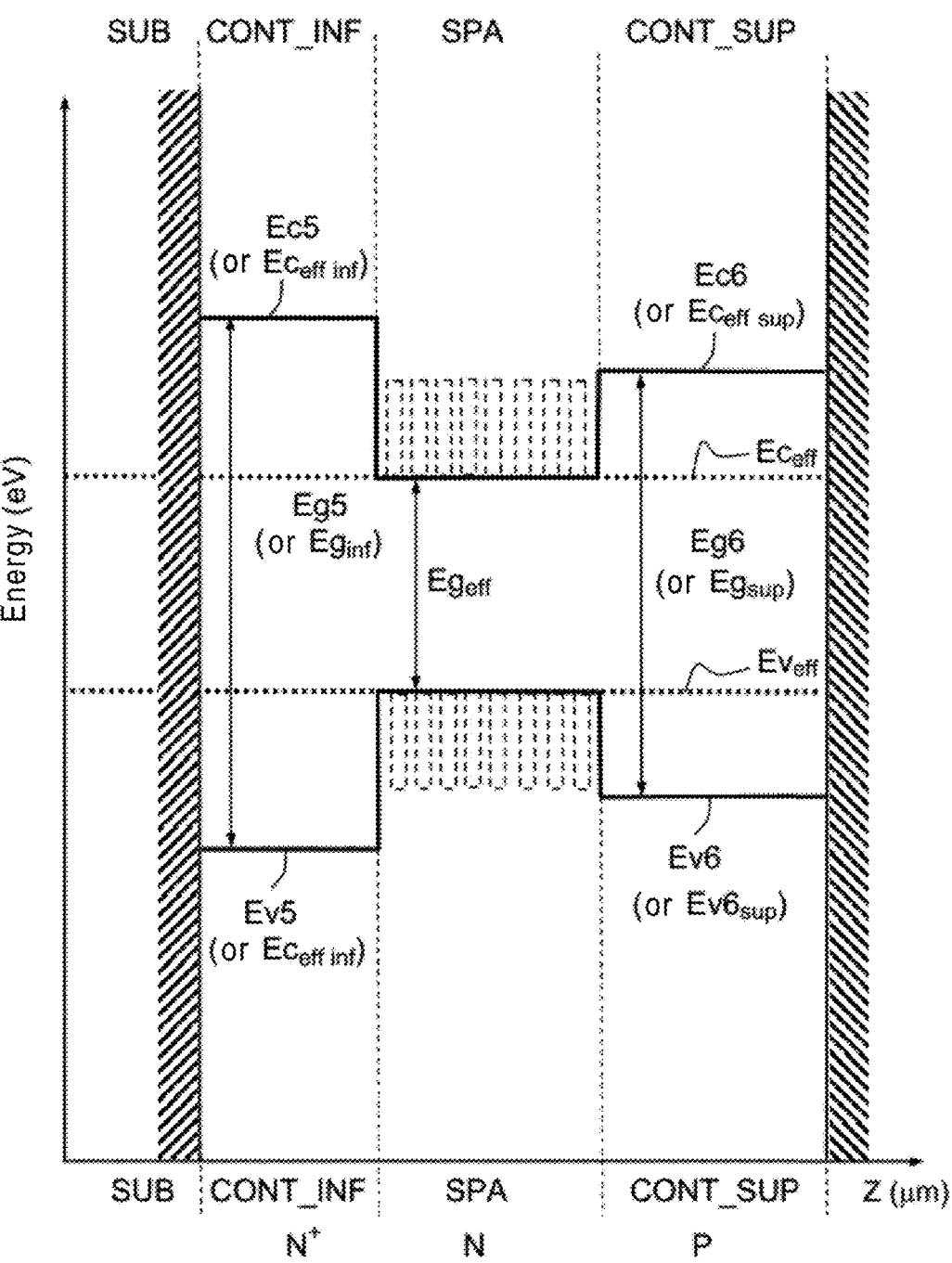
FIG. 5*b* illustrates the band diagram along the axis of the pixel of FIG. 5*a*.

FIG. 5a illustrates a cross-sectional view of a first example of a pixel Pxl comprising a planar absorbing structure according to the invention. FIG. 5b illustrates a band diagram along the axis of the pixel Pxl of FIG. 5a.

The pixel Pxl comprises, in the stacking direction Z (or along the pixel axis), in this order: the substrate SUB, which has the characteristics detailed above, a lower contact layer CONT_INF made of a $n^+$-doped fifth semiconductor SC5, a planar absorbing structure SPA according to the invention with n-doped layers C1, C2 and C3, and an upper contact layer CONT_SUP made of a p-doped sixth semiconductor SC6.

The fifth semiconductor SC5 has a fifth valence-band maximum Ev5 strictly lower than the effective valence-band maximum $Ev_{eff}$ of the superlattice SR1 (or SR2) according to the invention, such as illustrated in FIG. 5b.

The fifth semiconductor SC5 further has a bandgap Eg5 wider than or equal to the effective bandgap $Eg_{eff}$ of the superlattice SR1 (or SR2) according to the invention, such as illustrated in FIG. 5b.

By way of non-limiting example, it is possible to use the following materials to produce the lower contact: $n^+$-doped InGaAs or $n^+$-doped InAlAs or $n^+$-doped InP.

Alternatively, it is possible to produce the lower contact CONT_INF using a superlattice SR_INF with a stack of $n^+$-doped layers. The superlattice used for the lower contact CONT_INF has an effective valence-band maximum $Ev_{eff\_inf}$ strictly lower than the effective valence-band maximum $Ev_{eff}$ of the superlattice SR1 (or SR2) according to the invention. The superlattice used for the lower contact CONT_INF further has an effective bandgap $Eg_{eff\_inf}$ wider than or equal to the effective bandgap $Eg_{eff}$ of the superlattice SR1 (or SR2) according to the invention, such as illustrated in FIG. 5b.

The sixth semiconductor SC6 used to produce the upper contact CONT_SUP has a sixth valence-band maximum Ev6 strictly lower than the effective valence-band maximum $Ev_{eff}$ of the superlattice SR1 (or SR2) according to the invention, such as illustrated in FIG. 5b.

The sixth semiconductor SC6 further has a sixth conduction-band minimum Ec6 strictly higher than the effective conduction-band minimum $Ec_{eff}$ of the superlattice SR1 (or SR2) according to the invention, such as illustrated in FIG. 5b.

By way of non-limiting example, it is possible to use the following materials to produce the upper contact: $p^+$-doped InGaAs or $p^+$-doped InAlAs or $p^+$-doped InP.

Alternatively, it is possible to produce the upper contact CONT_SUP using a superlattice SR_SUP with a stack of p-doped layers. The superlattice used for the upper contact CONT_SUP has an effective valence-band maximum $Ev_{eff\_sup}$ strictly lower than the effective valence-band maximum $Ev_{eff}$ of the superlattice SR1 (or SR2) according to the invention. The superlattice used for the upper contact CONT_SUP further has an effective conduction-band minimum $Ec_{eff\_sup}$ strictly higher than the effective conduction-band minimum $Ec_{eff}$ of the superlattice SR1 (or SR2) according to the invention, such as illustrated in FIG. 5b.

In the case where the limits of the pixel are defined by doped regions such as illustrated in FIG. 1b, the p-type dopant used to produce the upper contact CONT_SUP may partially diffuse into the volume of the absorbing region at the interface with the sixth semiconductor SC6 (or superlattice SR_SUP). This region is thus considered to form part of the upper contact CONT_SUP.

Figure 5C:
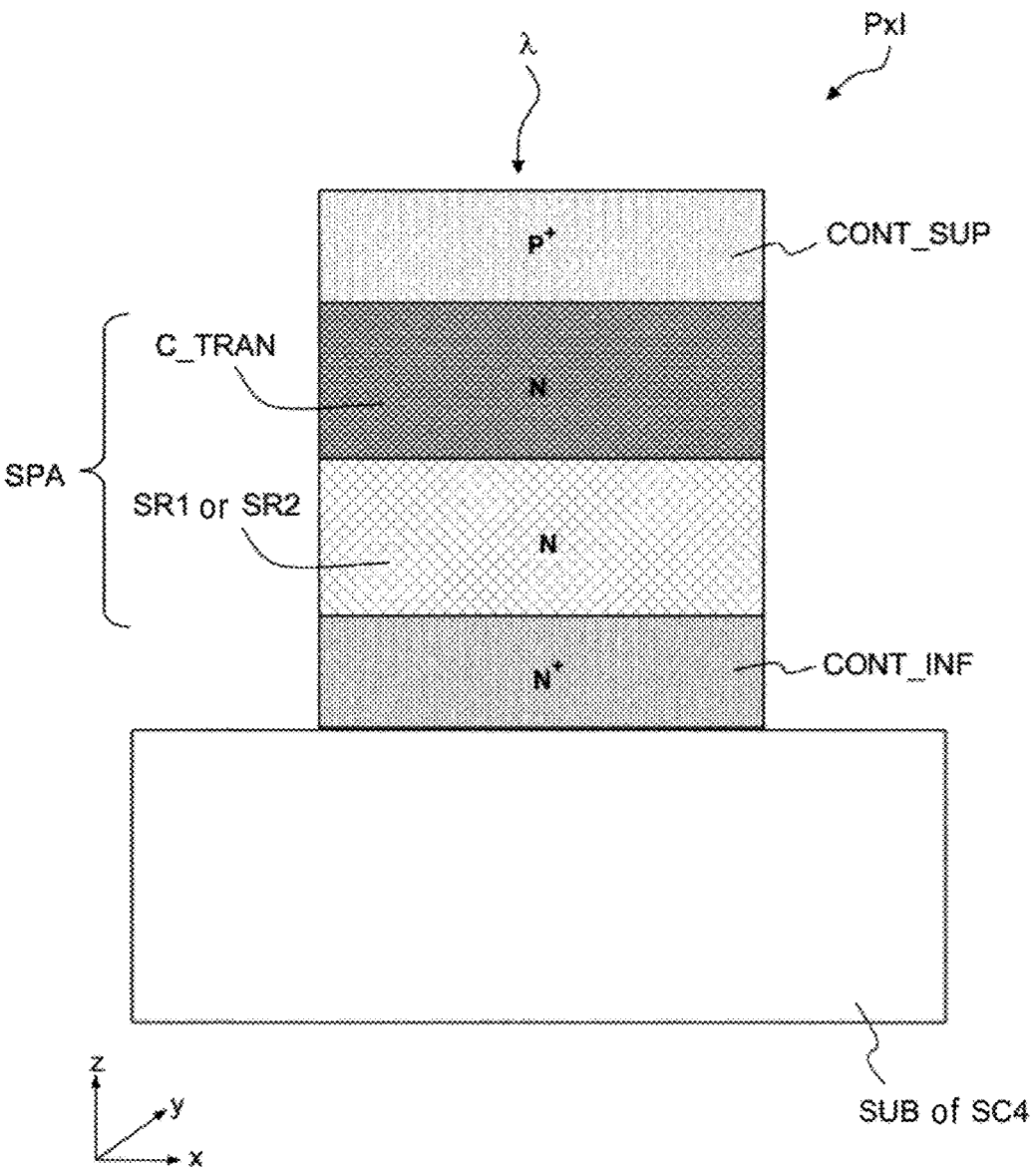
FIG. 5*c* illustrates a cross-sectional view of a second example of a pixel comprising a planar absorbing structure according to any one of the embodiments of the invention.
Figure 5D:
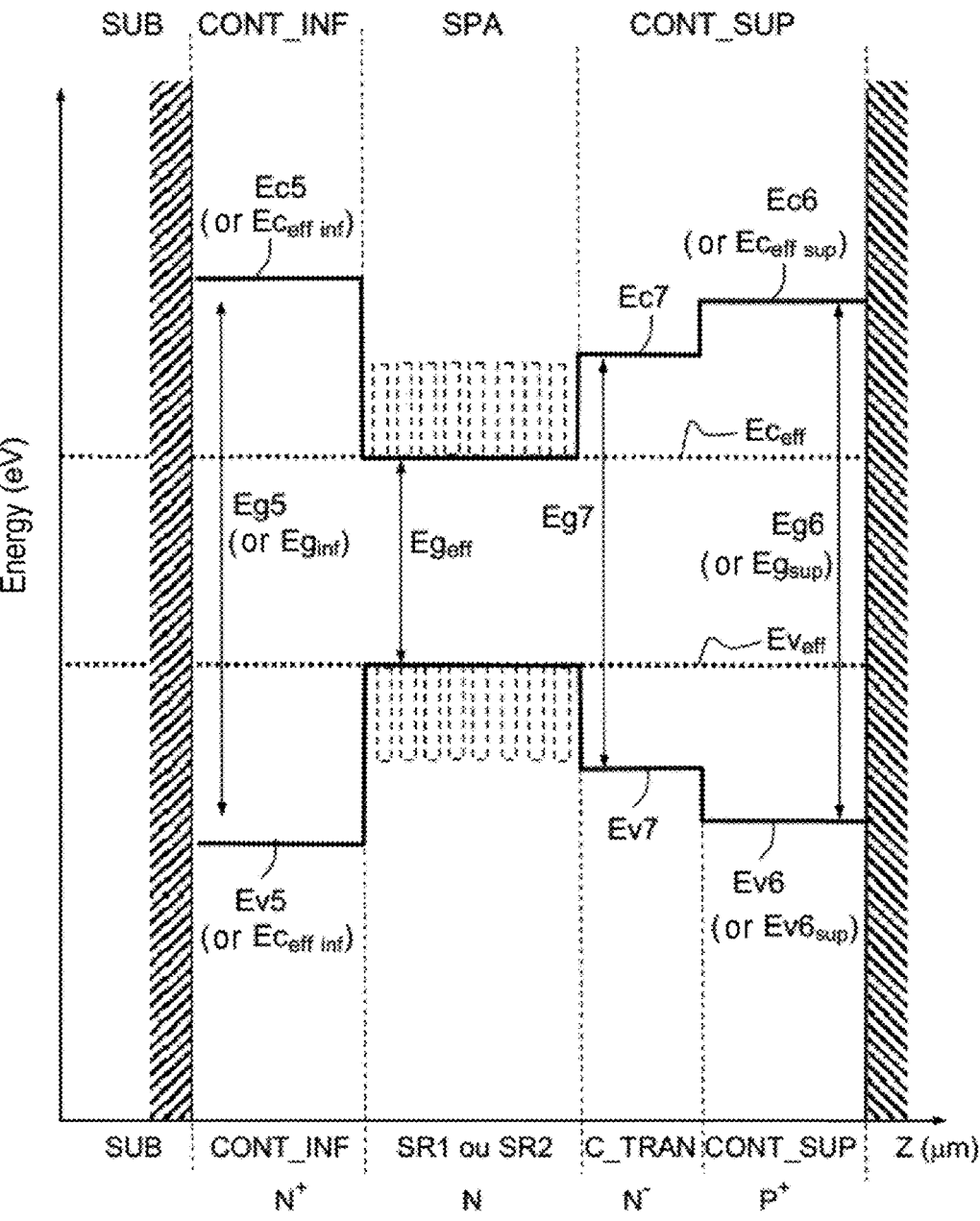
FIG. 5*d* illustrates the band diagram along the axis of the pixel of FIG. 5*c*.

FIG. 5c illustrates a cross-sectional view of a second example of a pixel Pxl comprising a planar absorbing structure according to the invention. FIG. 5d illustrates a band diagram along the axis of the pixel Pxl of FIG. 5c.

The pixel Pxl of FIG. 5c has the same characteristics has the pixel described above and illustrated in FIG. 5a. The stack of the pixel Pxl of FIG. 5c differs in the insertion of an additional structure denoted the transition structure C_trans, which is confined between the planar absorbing structure and the upper contact CONT_SUP, such as illustrated in FIG. 5d.

The transition structure C_trans is made of an n-doped seventh semiconductor SC7 having a seventh conduction-band minimum Ec7 comprised between, on the one hand, the effective conduction-band minimum $Ec_{eff}$ of the first superlattice according to the invention SR1 (or SR2), and on the other hand, the sixth conduction-band minimum Ec6, such as illustrated in FIG. 5d.

Alternatively, considering the case where the upper contact CONT_SUP is produced using a superlattice of $p^+$-doped layers, the seventh conduction-band minimum Ec7 is comprised between, on the one hand, the effective conduction-band minimum $Ec_{eff}$ of the first superlattice according to the invention SR1 (or SR2), and on the other hand, the effective conduction-band minimum $Ec_{eff\_sup}$ of the superlattice of the upper contact CONT_SUP, such as illustrated in FIG. 5d.

The p-doped seventh semiconductor SC7 further has a seventh valence-band maximum Ev7 comprised between, on the one hand, the effective valence-band maximum $Ev_{eff}$ of the first superlattice SR1 (or SR2) according to the invention, and on the other hand, the sixth valence-band maximum Ev6, such as illustrated in FIG. 5d.

Alternatively, considering the case where the upper contact CONT_SUP is produced using a superlattice of $p^+$-doped layers, the seventh valence-band maximum Ev7 is comprised between, on the one hand, the effective valence-band maximum $Ev_{eff}$ of the first superlattice according to the invention SR1 (or SR2), and on the other hand, the effective valence-band maximum $Ev_{eff\_sup}$ of the superlattice of the upper contact CONT_SUP.

From a dimensional point of view, it is possible to produce the transition structure C_TRAN with an $n^-$-doped layer of a bulk semiconductor such as the ternary alloy $In_{0.53}Ga_{0.47}As$ with a thickness comprised between 1 μm and 3 μm, deposited on a superlattice according to the invention having an overall thickness comprised between 1 μm and 3 μm.

Figure 6:
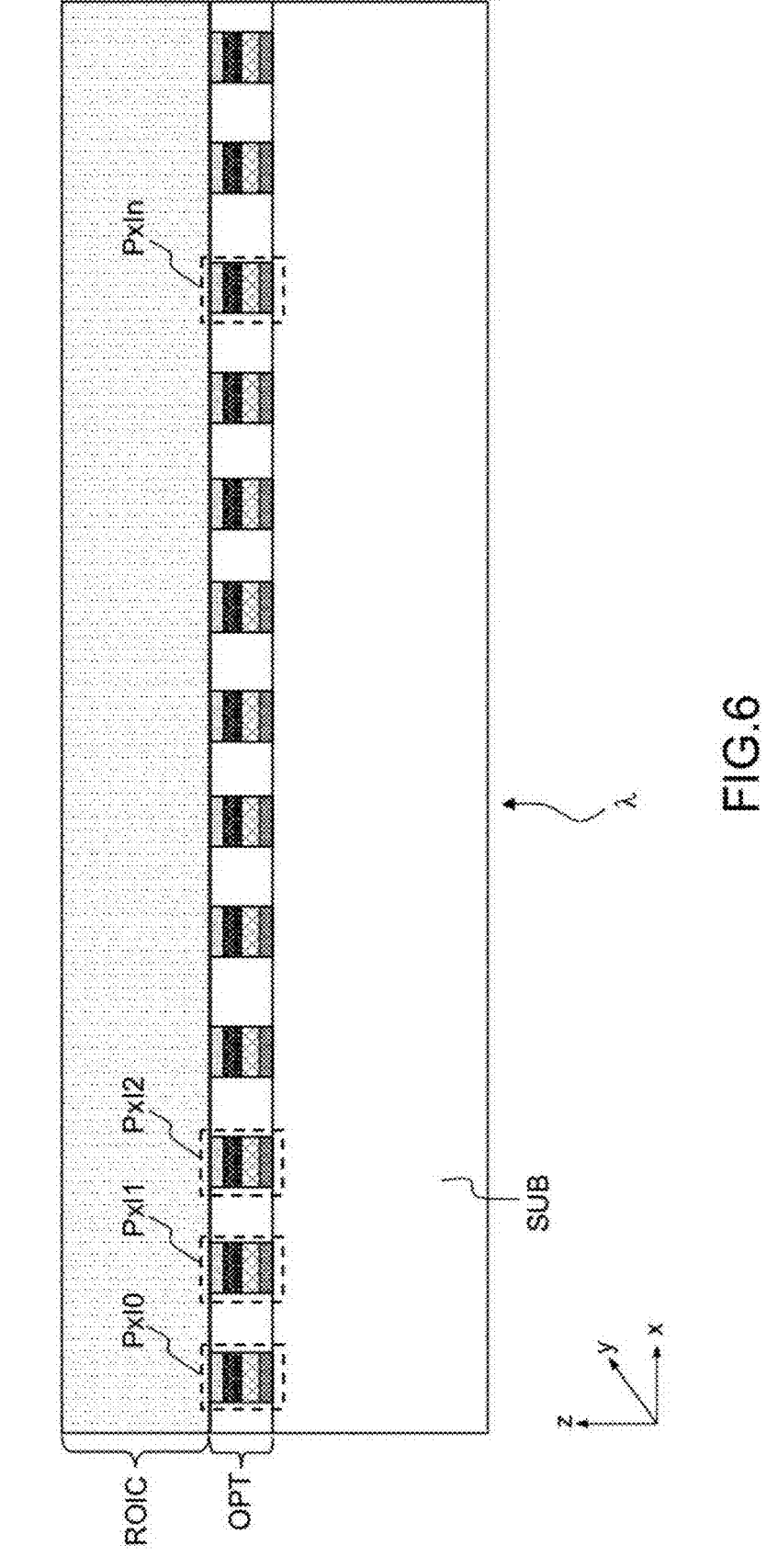
FIG. 6 illustrates a cross-sectional view of a device for detecting infrared radiation comprising a plurality of pixels according to the invention.

FIG. 6 illustrates a cross-sectional view of a device D1 for detecting infrared radiation comprising a plurality of pixels Pxl according to the invention.

The device D1 for detecting infrared radiation is mounted on the substrate SUB. It is a question of a hybrid optoelectronic system comprising: an optical portion OPT based on a matrix array formed by a plurality of pixels arranged in rows and in columns; and an electronic portion consisting of a read-out integrated circuit ROIC on a semiconductor substrate, allowing the signal of each pixel of the optical portion OPT to be read out individually. A pixel belonging to the optoelectronic system may contain a single photoelectric element or a plurality of photosensitive elements connected to one another.

Alternatively, for specific applications, it is envisionable to produce the optical portion OPT with a single pixel Pxl.

The read-out integrated circuit ROIC is produced by means of plurality of transistors and of thin layers of conductors, semiconductors or dielectrics in CMOS technology (CMOS standing for Complementary Metal-Oxide-Semiconductor) on a silicon substrate. Each pixel Pxl is associated with a buried electrode with a view to reading out the signals generated by the charge carriers photogenerated by the photodetecting structure of a pixel Pxl.

In conclusion, the described invention provides a new superlattice structure for the planar absorbing structure of a pixel for detecting in the SWIR domain. The superlattice structure according to the invention allows targeted cutoff wavelengths beyond 2.1 µm to be obtained while decreasing the effective mass of the positive charge carriers (holes), this improving the quantum efficiency of the detector with respect to prior-art solutions on InP. In addition, the fabricating process and the chosen superlattice materials according to the invention are compatible with mature fabricating-process technologies such as technologies based on InP substrates.

The invention claimed is:

1. A device (D1) for detecting infrared radiation comprising at least one pixel (Pxl), a pixel comprising a planar absorbing structure (SPA), said planar absorbing structure (SPA) comprising:

a first superlattice (SR1, SR2) comprising a stack along a stacking direction (Z) of an elementary group (G1, G2) of semiconductor layers, the semiconductor layers of said elementary group (G1, G2) each being arranged in a crystalline lattice structure of unit cells;

said elementary group comprising:

a first layer (C1) made of a first semiconductor (SC1) having a first bandgap (Eg1), and a first conduction-band minimum (Ec1);

at least a second layer (C2) made of a second semiconductor (SC2) having a second bandgap (Eg2), and a second conduction-band minimum (Ec2) strictly lower than the first conduction-band minimum (Ec1);

a third layer (C3) made of a third semiconductor (SC3) having a third bandgap (Eg3) narrower than the first and second bandgaps (Eg1, Eg2), and a third conduction-band minimum (Ec3) strictly lower than the second conduction-band minimum (Ec2);

the elementary group (G1, G2) being produced:

in a first stacking configuration in the following order: the second layer (C2), the third layer (C3), the second layer (C2), then the first layer (C1);

or in a second stacking configuration such that the third layer (C3) is confined between the first and second layers (C1, C2):

wherein the first semiconductor (SC1) further has a first valence-band maximum (Ev1) and the second semiconductor (SC2) further has a second valence-band maximum (Ev2) strictly lower than the first valence-band maximum (Ev1).

2. The device (D1) for detecting infrared radiation as claimed in claim 1, wherein the first superlattice (SR1, SR2) is produced by epitaxy on a substrate (Sub) made of a fourth semiconductor (SC4) arranged in a crystalline lattice structure of unit cells, said first superlattice (SR1, SR2) being produced such that, for each semiconductor layer (C1, C2, C3) of the first superlattice (SR1, SR2), the lattice of a semiconductor layer (C1, C2, C3) undergoes internal mechanical strains to match the lattice of the crystal structure of the substrate (SUB).

3. The device (D1) for detecting infrared radiation as claimed in claim 2, wherein the first, second, third and fourth semiconductors (SC1, SC2, SC3, SC4) are III-V semiconductors.

4. The device (D1) for detecting infrared radiation as claimed in claim 3, wherein the fourth semiconductor (SC4) is indium phosphide (InP).

5. The device (D1) for detecting infrared radiation as claimed in claim 3, wherein the compositions of the materials used to produce the semiconductor layers of said elementary group are chosen such that the band diagram of the conduction and valence bands in the stacking direction (Z) of the first superlattice has an effective bandgap ($Eg_{eff}$), an effective valence-band maximum ($EV_{eff}$) and an effective conduction-band minimum ($EC_{eff}$), said effective bandgap ($Eg_{eff}$) being between 400 meV and 750 meV.

6. The device (D1) for detecting infrared radiation as claimed in claim 5, wherein the effective mass of positive charge carriers in the superlattice (SR1, SR2) in the stacking direction (Z) is lower than three times the mass of a free electron.

7. The device (D1) for detecting infrared radiation as claimed in claim 3, wherein the third semiconductor (SC3) is the binary composite InAs.

8. The device (D1) for detecting infrared radiation as claimed in claim 3, wherein the second semiconductor (SC2) is the ternary alloy $In_xGa_{1-x}As$, with x the mole fraction of indium in the alloy $In_xGa_{1-x}As$.

9. The device (D1) for detecting infrared radiation as claimed in claim 8, wherein the mole fraction x of indium In in the second semiconductor (SC2) is lower than 0.55.

10. The device (D1) for detecting infrared radiation as claimed in claim 3, wherein the first semiconductor (SC1) is the ternary alloy $GaAs_ySb_{1-y}$, with y the mole fraction of arsenic in the alloy $GaAs_ySb_{1-y}$.

11. The device (D1) for detecting infrared radiation as claimed in claim 10, wherein the mole fraction y of arsenic As in the first semiconductor (SC1) is lower than 0.55.

12. The device (D1) for detecting infrared radiation as claimed in claim 9, wherein the ratio between, on the one hand, the sum of the thicknesses of the layers (C1, C2, C3) of the elementary group (G1, G2) weighted by the amplitude of the strains undergone by each layer (C1, C2, C3), and on the other hand, the total thickness of the elementary group (G1, G2), is lower than or equal to a predetermined value.

13. The device (D1) for detecting infrared radiation as claimed in claim 8, wherein the strains undergone by the lattice of the $In_xGa_{1-x}As$ layer are tensile strains, and the strains undergone by the lattice of the $GaAs_ySb_{1-y}$ layer are compressive strains.

14. The device (D1) for detecting infrared radiation as claimed in claim 8, wherein the amplitude of a strain undergone by the lattice of any one layer (C1, C2, C3) of the elementary group (G1) is lower than a limiting strain at which dislocation occurs.

15. The device (D1) for detecting infrared radiation as claimed in claim 8, wherein the thickness of a layer (C1, C2, C3) of the elementary group (G1) is comprised between 0.3 nm and 10 nm.

16. A detecting device (D1) as claimed in claim 5, wherein a pixel comprises, along the stacking direction (Z), in this order:

the substrate (SUB);

a lower contact layer (CONT_INF) made of an $n^+$-doped fifth semiconductor (SC5) having:

a fifth valence-band maximum (Ev5) strictly lower than the effective valence-band maximum ($EV_{eff}$) of the first superlattice (SR1, SR2);

and a fifth bandgap (Eg5) wider than or equal to the effective bandgap ($Eg_{eff}$) of the first superlattice (SR1, SR2);

the planar absorbing structure (SPA), in which the semiconductor layers (C1, C2, C3) of the first superlattice (SR1, SR2) are n-doped;

an upper contact layer (CONT_SUP) made of a $p^+$-doped sixth semiconductor (SC6) having:

a sixth valence-band maximum (Ev6) strictly lower than the effective valence-band maximum ($EV_{eff}$) of the first superlattice (SR1, SR2);

and a sixth conduction-band minimum (Ec5) strictly higher than the effective conduction-band minimum ($EC_{eff}$) of the first superlattice (SR1, SR2).

17. The detecting device (D1) as claimed in claim 5, wherein a pixel comprises, along the stacking direction (Z), in this order:

the substrate (SUB);

a lower contact (CONT_INF) produced using an $n^+$-doped second superlattice (SR_inf) respectively having:

a second effective valence-band maximum ($EV_{eff\_inf}$) strictly lower than the effective valence-band maximum ($EV_{eff}$) of the first superlattice (SR1, SR2);

a second effective bandgap ($Eg_{eff\_inf}$) wider than or equal to the effective bandgap ($Eg_{eff}$) of the first superlattice (SR1, SR2);

the planar absorbing structure (SPA), in which the semiconductor layers (C1, C2, C3) of the first superlattice (SR1, SR2) are n-doped;

an upper contact (CONT_SUP) produced using a third superlattice (SR_sup) respectively having:

a third effective valence-band maximum ($EV_{eff\_sup}$) strictly lower than the effective valence-band maximum ($EV_{eff}$) of the first superlattice (SR1, SR2);

an effective third conduction-band minimum ($EC_{eff\_sup}$) strictly higher than the effective conduction-band minimum ($EC_{eff}$) of the first superlattice (SR1, SR2).

18. The detecting device (D1) as claimed in claim 16, wherein the planar absorbing structure (SPA) further comprises a transition layer (C_trans) made of an n-doped seventh semiconductor (SC7) having:

a seventh conduction-band minimum (Ec7) comprised between:

on the one hand the effective conduction-band minimum ($Ec_{eff}$) of the first superlattice (SR1, SR2);

and on the other hand the sixth conduction-band minimum (Ec6);

a seventh valence-band maximum (Ev7) comprised between:

on the one hand the effective valence-band maximum ($EV_{eff}$) of the first superlattice (SR1, SR2);

and on the other hand the sixth valence-band maximum (Ev6);

the transition layer (C_trans) being confined between the superlattice (SR1, SR2) and the upper contact layer (CONT_SUP).

19. The detecting device (D1) as claimed in claim 17, wherein the planar absorbing structure (SPA) further comprises a transition layer (C_trans) made of an n-doped fifth semiconductor (SC7) having:

a fifth conduction-band minimum (Ec7) comprised between:

on the one hand the effective conduction-band minimum ($Ec_{eff}$) of the first superlattice (SR1, SR2);

and on the other hand the effective third conduction-band minimum ($EC_{eff\_sup}$);

a fifth valence-band maximum (Ev7) comprised between:

on the one hand the effective valence-band maximum ($EV_{eff}$) of the first superlattice (SR1, SR2);

and on the other hand the third effective valence-band maximum ($EV_{eff\_sup}$);

the transition layer (C_trans) being confined between the superlattice (SR1, SR2) and the upper contact layer (CONT_SUP).

* * * * *